(12) United States Patent
Park

(10) Patent No.: US 12,501,803 B2
(45) Date of Patent: Dec. 16, 2025

(54) DISPLAY DEVICE AND METHOD OF MANUFACTURING THE SAME

(71) Applicant: Samsung Display Co., LTD., Yongin-si (KR)

(72) Inventor: Jae-Hyun Park, Yongin-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 767 days.

(21) Appl. No.: 17/705,545

(22) Filed: Mar. 28, 2022

(65) Prior Publication Data

US 2023/0011322 A1    Jan. 12, 2023

(30) Foreign Application Priority Data

Jul. 12, 2021    (KR) .................. 10-2021-0090910

(51) Int. Cl.
*H10K 59/13* (2023.01)
*H10K 59/122* (2023.01)
*H10K 59/124* (2023.01)
*H10K 59/131* (2023.01)
*H10K 59/80* (2023.01)
(Continued)

(52) U.S. Cl.
CPC ....... *H10K 59/1315* (2023.02); *H10K 59/122* (2023.02); *H10K 59/124* (2023.02); *H10K 59/80522* (2023.02); *H10K 71/60* (2023.02); *H10K 59/1201* (2023.02); *H10K 71/00* (2023.02)

(58) Field of Classification Search
CPC .. H10K 50/824; H10K 59/122; H10K 59/124; H10K 71/00; H10K 71/60; H10K 59/1201; H10K 71/135; H10K 59/80522; H10K 59/1315; H10K 59/131; H10K 50/805

See application file for complete search history.

(56) References Cited

U.S. PATENT DOCUMENTS 11,594,701 B2 *   2/2023   Baek ................. H10K 59/80522
12,127,438 B2 *  10/2024   Lee ...................... H10K 59/122
(Continued)

FOREIGN PATENT DOCUMENTS

CN    108511489          9/2018
JP    2015-198605        4/2017
KR    10-2004-0087108   10/2004

OTHER PUBLICATIONS

Extended European Search Report for European Patent Application or Patent No. 22183497.1, dated Nov. 4, 2022.

*Primary Examiner* — S M Sohel Imtiaz
(74) *Attorney, Agent, or Firm* — Harness, Dickey & Pierce P.L.C.

(57) ABSTRACT

A display device includes an auxiliary wire, a connection pattern, a light emitting layer, an upper common layer, and an upper electrode. The display device includes a sub-pixel region and a contact region. The auxiliary wire is disposed on a substrate in the contact region. The connection pattern is disposed on the auxiliary wire. The light emitting layer is disposed on the substrate in the sub-pixel region. The upper common layer is disposed on the light emitting layer and the connection pattern, and includes openings that expose the connection pattern. The upper electrode is disposed on the upper common layer and contacts the connection pattern by passing through the openings.

16 Claims, 22 Drawing Sheets

(51) Int. Cl.
*H10K 71/60* (2023.01)
*H10K 59/12* (2023.01)
*H10K 71/00* (2023.01)

(56) References Cited

U.S. PATENT DOCUMENTS

| | | | |
|---|---|---|---|
| 2007/0132368 A1* | 6/2007 | Kuwahara | H10K 50/824 |
| | | | 313/506 |
| 2016/0093680 A1* | 3/2016 | Paek | H10K 50/805 |
| | | | 438/34 |
| 2017/0125725 A1* | 5/2017 | Paek | H10K 59/1315 |
| 2018/0006106 A1* | 1/2018 | Oh | H10K 59/1216 |
| 2018/0190944 A1* | 7/2018 | Lee | H10K 71/00 |
| 2019/0006443 A1* | 1/2019 | Hanashima | H10K 59/122 |
| 2019/0165068 A1* | 5/2019 | Park | H10K 59/126 |
| 2019/0165085 A1* | 5/2019 | Choi | H10K 50/824 |
| 2022/0165980 A1* | 5/2022 | Shim | H10K 59/80522 |
| 2022/0384542 A1* | 12/2022 | Wang | H10K 59/80522 |
| 2023/0180581 A1* | 6/2023 | Zhao | H10K 50/813 |
| | | | 257/91 |

* cited by examiner

DISPLAY DEVICE AND METHOD OF MANUFACTURING THE SAME

CROSS-REFERENCE TO RELATED APPLICATION(S)

This application claims priority to and benefits of Korean Patent Application No. 10-2021-0090910 under 35 U.S.C. § 119, filed in the Korean Intellectual Property Office (KIPO) on Jul. 12, 2021, the entire contents of which are incorporated herein by reference.

BACKGROUND

1. Technical Field

Embodiments relate generally to a display device and a method of manufacturing a display device. More specifically, embodiments of the disclosure relate to a display device including an auxiliary wire a method of manufacturing a display device including an auxiliary wire.

2. Description of Related Art

Flat panel display devices are used as display devices for replacing a cathode ray tube display device due to light-weight and thin characteristics thereof. As representative examples of such flat panel display devices, there are a liquid crystal display device, an organic light emitting diode display device, a quantum dot display device, and the like.

Recently, a display device having a large size and a high resolution has been developed. The display device may include a display region, a pad region, and the like. In this case, pixels may be disposed in the display region, and an image may be displayed through the pixels. In addition, signal wires and power supply wires that are electrically connected to the pixels may be disposed at an outermost periphery of the display region. Furthermore, pad electrodes may be disposed in the pad region. An external device may generate signals, a power supply voltage, and the like, and provide the signals and the power supply voltage to the pixels through the pad electrodes and the wires.

As a size of the display region increases due to enlargement of the display device, a voltage drop may be caused.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device capable of preventing a voltage drop.

Embodiments provide a method of manufacturing the display device with reduced manufacturing cost.

According to the embodiments of the disclosure, a display device includes an auxiliary wire, a connection pattern, a light emitting layer, an upper common layer, and an upper electrode. The display device includes a sub-pixel region and a contact region. The auxiliary wire is disposed on a substrate in the contact region. The connection pattern is disposed on the auxiliary wire. The light emitting layer is disposed on the substrate in the sub-pixel region. The upper common layer is disposed on the light emitting layer and the connection pattern, and includes openings that expose the connection pattern. The upper electrode is disposed on the upper common layer, and contacts the connection pattern by passing through the openings.

In embodiments, the openings of the upper common layer may be adjacent to a portion in which the connection pattern and the upper electrode overlap each other in a plan view.

In embodiments, the display device may further include a pixel defining layer disposed between the substrate and the upper electrode, and may have a first opening formed in the sub-pixel region and a second opening formed in the contact region.

In embodiments, the light emitting layer may be disposed only in the first opening, and the upper common layer may be disposed in both the first opening and the second opening.

In embodiments, the pixel defining layer may overlap side portions of the connection pattern in a plan view.

In embodiments, the display device may further include a lower electrode disposed in the sub-pixel region between the substrate and the light emitting layer.

In embodiments, the lower electrode and the connection pattern may be located on a same layer.

In embodiments, the display device may further include a lower common layer disposed in the sub-pixel region between the lower electrode and the light emitting layer.

In embodiments, each of the upper and lower common layers may include an organic material.

In embodiments, the display device may further include a planarization layer disposed between the substrate and the light emitting layer, and a pixel defining layer disposed on the planarization layer. The pixel defining layer may overlap a first side portion of the connection pattern, and exposing a second side portion of the connection pattern in a plan view.

In embodiments, the upper common layer may contact the planarization layer in the contact region.

In embodiments, the display device may further include an interlayer insulating layer disposed on the substrate, a planarization layer disposed on the interlayer insulating layer and having a first opening that exposes the interlayer insulating layer in the contact region, and a pixel defining layer disposed on the planarization layer. The pixel defining layer may overlap a first side portion of the connection pattern and having a second opening that exposes a second side portion of the connection pattern in a plan view.

In embodiments, the upper common layer may contact the interlayer insulating layer in the contact region.

In embodiments, the display device may further include a contact pattern disposed in the contact region on the interlayer insulating layer.

In embodiments, a portion of the contact pattern may contact the connection pattern, and another portion of the contact pattern may contact the upper common layer.

In embodiments, the contact pattern and the auxiliary wire may be disposed on a same layer.

According to the embodiments of the disclosure, a method of manufacturing a display device includes forming an auxiliary wire on a substrate in a contact region of the display device, forming a connection pattern formed on the auxiliary wire, forming a light emitting layer on the substrate in a sub-pixel region of the display device, forming an upper common layer on the light emitting layer and the connection pattern, forming an upper electrode on the upper common layer, applying a voltage to the auxiliary wire and the upper electrode to cause dielectric breakdown of the upper common layer located between the upper electrode and the connection pattern so that an opening is formed in the upper common layer, and allowing the upper electrode to contact the connection pattern by allowing the upper electrode to pass through the opening.

In embodiments, the allowing of the upper electrode to contact the connection pattern by allowing the upper electrode to pass through the opening may include melting a portion of the upper electrode located in the contact region by heat generated between the upper electrode and the connection pattern, filling the opening with the molten upper electrode, and allowing the molten upper electrode passing through the opening to contact the connection pattern.

In embodiments, the method may further include forming a lower electrode in the sub-pixel region on the substrate, simultaneously with the forming of the connection pattern on the auxiliary wire.

In embodiments, the method may further include forming a lower common layer on the lower electrode, before the forming of the light emitting layer in the sub-pixel region on the substrate.

In embodiments, each of the lower and upper common layers may include an organic material, the lower common layer and the light emitting layer are formed by an inkjet printing method, and the upper common layer is formed by a vacuum deposition method.

In embodiments, the method may further include forming a pixel defining layer overlapping in a plan view side portions of the lower electrode in the sub-pixel region and side portions of the connection pattern in the contact region, after the forming of the lower electrode and the connection pattern.

Since the display device according to the embodiments of the disclosure includes the upper common layer including the openings, the upper electrode and the connection pattern may be readily and electrically connected to each other. Accordingly, the voltage drop may not be caused in the display device. The openings may prevent the voltage drop in the display device.

According to the method of manufacturing the display device of the embodiments of the disclosure, the openings may be formed in the upper common layer through a simple process such as a process of applying a voltage (e.g., voltage difference) to the auxiliary wire and the upper electrode, and the upper electrode and the connection pattern may be readily and electrically connected to each other. Accordingly, a voltage drop may not be caused in the display device. The openings may prevent the voltage drop in the display device.

In addition, the upper electrode and the connection pattern may be electrically connected to each other without an additional process such as a laser drilling process. Thus, a manufacturing cost of the display device may be reduced.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
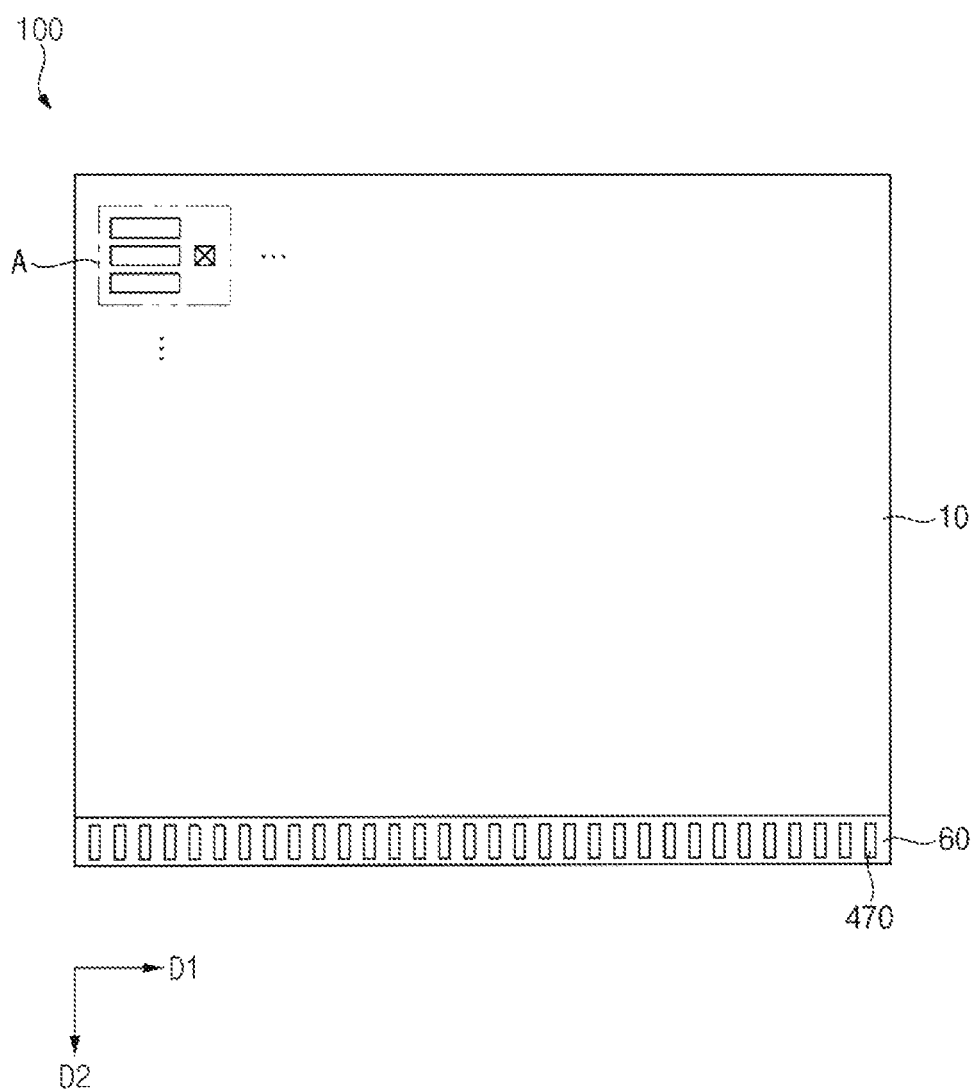
FIG. 1 is a schematic plan view showing a display device according to embodiments of the disclosure.

Hereinafter, display devices and a method of manufacturing a display device according to embodiments of the disclosure will be described hereinafter with reference to the accompanying drawings. Although the embodiments may be modified in various manners and have additional embodiments, embodiments are illustrated in the accompanying drawings and will be mainly described in the specification. However, the scope of the disclosure is not limited to the embodiments in the accompanying drawings and the specification and should be construed as including all the changes, equivalents and substitutions included in the spirit and scope of the disclosure.

Some of the parts which are not associated with the description may not be provided in order to describe embodiments of the disclosure and like reference numerals refer to like elements through the specification.

In the drawings, sizes and thicknesses of elements may be enlarged for clarity and ease of description thereof. However, the disclosure is not limited to the illustrated sizes and thicknesses. In the drawings, the thicknesses of layers, films, panels, regions, and other elements may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a cross-sectional view" means when a cross-section taken by vertically cutting an object portion is viewed from the side.

When a layer, film, region, substrate, or area, is referred to as being "on" another layer, film, region, substrate, or area, it may be directly on the other layer, film, region, substrate, or area, or intervening layers, films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein. For example, a first color filter may be any one of a red, green, or blue color filter. A second color filter may be any one of a red, green, or blue color filter. A third color filter may be any one of a red, green, or blue color filter. First and second with respect to the light blocking members may be used interchangeably in the specification.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 80%, 5% of the stated value.

In the specification and the claims, the phrase "at least one of" is intended to include the meaning of "at least one selected from the group of" for the purpose of its meaning and interpretation. For example, "at least one of A and B" may be understood to mean "A, B, or A and B."

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Unless otherwise defined or implied herein, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
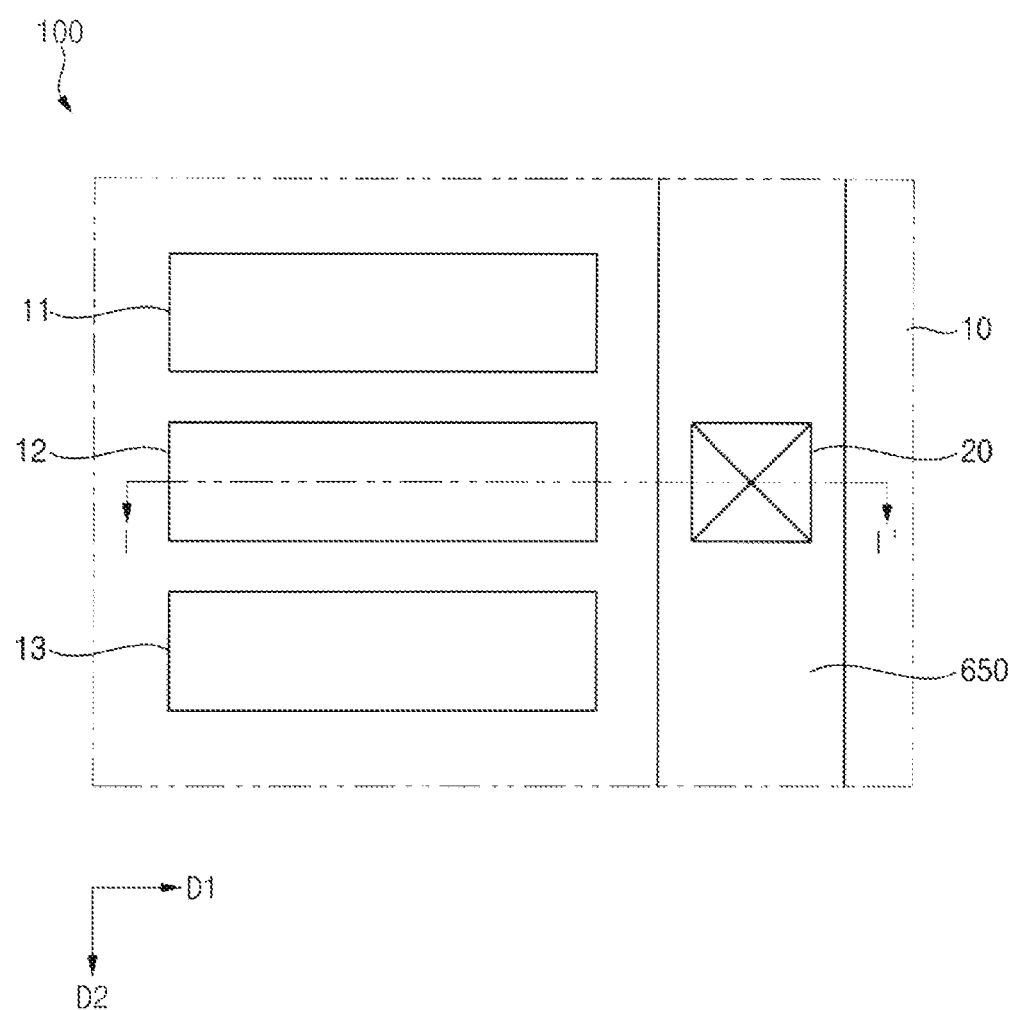
FIG. 2 is a partially enlarged plan view schematically showing region A of FIG. 1.
Figure 3:
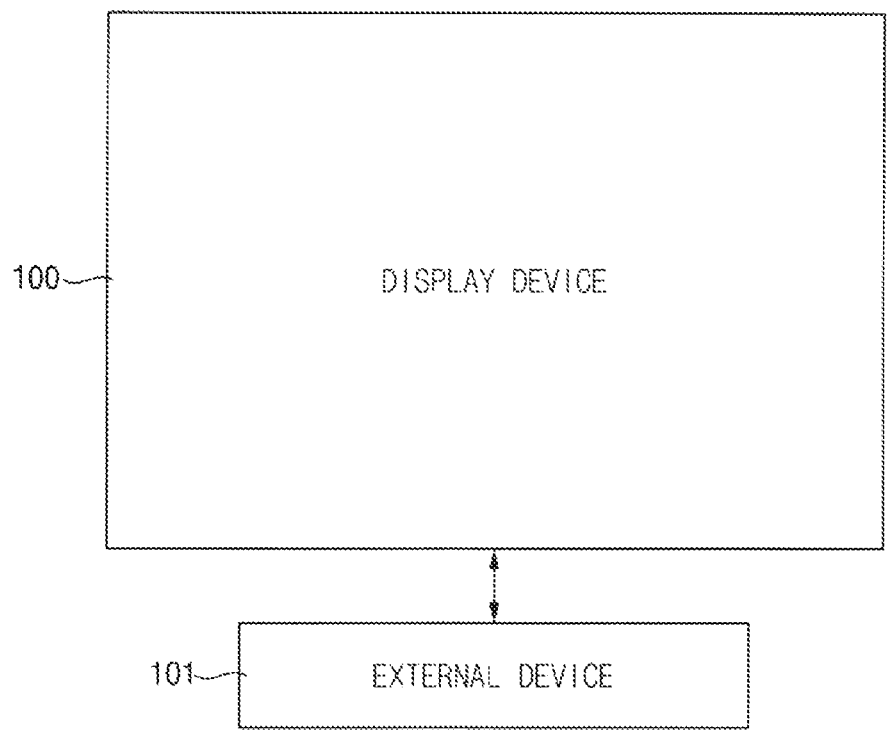
FIG. 3 is a schematic block diagram for describing an external device electrically connected to the display device of FIG. 1.

FIG. 1 is a schematic plan view showing a display device according to embodiments of the disclosure, and FIG. 2 is a partially enlarged plan view schematically showing region A of FIG. 1. FIG. 3 is a schematic block diagram for describing an external device electrically connected to the display device of FIG. 1.

Referring to FIGS. 1 to 3, a display device 100 may include an auxiliary wire 650, and pad electrodes 470.

The display device 100 may include a display region 10 and a pad region 60. The display device 100 may be divided into the display region 10 and the pad region 60. The display region 10 may include a first sub-pixel region 11, a second sub-pixel region 12, a third sub-pixel region 13, and a contact region 20. For example, the first to third sub-pixel regions 11, 12, and 13 and the contact region 20 may define a pixel region, and multiple pixel regions may be repeatedly arranged in a first direction D1 and a second direction D2. The first direction D1 may be substantially parallel to a top surface of the display device 100, and the second direction D2 may be substantially orthogonal to the first direction D1. The pixel regions may be arranged in a lattice shape over the whole display region 10. The pad region 60 may be located on a side of the display region 10.

A sub-pixel SP (e.g., refer to FIG. 4) may be disposed in each of the first to third sub-pixel regions 11, 12, and 13, and the sub-pixel SP may include transistors, an organic light emitting diode, and the like. An image may be displayed in the display region 10 through the sub-pixels SP.

For example, the sub-pixels SP may include first, second, and third sub-pixels. The first sub-pixel may include a first organic light emitting diode for emitting a red light. The second sub-pixel may include a second organic light emitting diode for emitting a green light. The third sub-pixel may include a third organic light emitting diode for emitting a blue light.

According to the embodiments, the first organic light emitting diode may overlap transistors included in the first sub-pixel in a plan view. The second organic light emitting diode may overlap transistors included in the second sub-pixel in a plan view. The third organic light emitting diode may overlap transistors included in the third sub-pixel in a plan view. In other embodiments, the first organic light emitting diode may overlap some of the transistors included in the first sub-pixel and some of transistors included in a sub-pixel that is different from the first sub-pixel in a plan view. The second organic light emitting diode may overlap some of the transistors included in the second sub-pixel and some of transistors included in a sub-pixel that is different from the second sub-pixel in a plan view. The third organic light emitting diode may overlap some of the transistors included in the third sub-pixel and some of transistors included in a sub-pixel that is different from the third sub-pixel in a plan view. The first to third organic light emitting diodes may be arranged by using various methods (or arrangements). For example, the first to third organic light emitting diodes may be arranged by using a method (or arrangement) in which rectangles having a same size are sequentially arranged (e.g., first to third organic light emitting diodes have a same rectangular shape), a method (or arrangement) including a blue organic light emitting diode having a large area (e.g., blue organic light emitting diode has greater size than other organic light emitting diodes), a method (or arrangement) further including a white organic light emitting diode (e.g., first to third organic light emitting diodes and white organic light emitting diode are included), a method (or arrangement) in which RG-GB patterns are repeatedly arranged (e.g., two green organic light emitting diode are adjacent to each other), or the like.

The sub-pixel SP may include at least one driving transistor, at least one switching transistor, at least one capacitor, and the like. According to the embodiments, the sub-pixel SP may include a driving transistor (e.g., a first transistor TR1 of FIG. 4), six switching transistors (e.g., second to seventh transistors TR2, TR3, TR4, TR5, TR6, and TR7 of FIG. 4), a storage capacitor (e.g., a storage capacitor CST of FIG. 4), and the like.

Although each of the display device 100, the display region 10, the first to third sub-pixel regions 11, 12, and 13, the contact region 20, and the pad region 60 according to the disclosure has been described as having a rectangular shape in a plan view, the shape of each of the display device 100, the display region 10, the first to third sub-pixel regions 11, 12, and 13, the contact region 20, and the pad region 60 is not limited thereto. For example, each of the display device 100, the display region 10, the first to third sub-pixel regions 11, 12, and 13, the contact region 20, and the pad region 60 may have a triangular shape, a rhombic shape, a polygonal shape, a circular shape, an elliptical shape, or a track shape in a plan view.

Although the pixel region according to the disclosure has been described as including a contact region 20, the configuration of the disclosure is not limited thereto. For example, the pixel region may include at least one contact region 20, and two adjacent pixel regions may include a contact region 20.

Wires may be disposed in the display region 10. For example, the wires may include a data signal wire, a gate signal wire, an emission control signal wire, a gate initialization signal wire, an initialization voltage wire, a first power supply wire, an auxiliary wire 650, and the like. The wires may be electrically connected to the sub-pixels SP. A second power supply wire, a gate driver, a data driver, and the like may be disposed at an outermost periphery of the display region 10.

According to the embodiments, the auxiliary wire 650 may extend in the second direction D2, and the auxiliary wire 650 and the sub-pixel SP may be electrically connected to each other in the contact region 20. For example, the pixel regions arranged in the second direction D2 in the display region 10 may overlap the auxiliary wire 650 (e.g., in a plan view), and the auxiliary wires 650 may be repeatedly arranged in the first direction D1 and spaced apart from each other.

Although the auxiliary wire 650 according to the disclosure has been described as extending in the second direction D2, the configuration of the disclosure is not limited thereto. For example, the auxiliary wire 650 may extend in the first direction D1, and the auxiliary wires 650 may be repeatedly arranged in the second direction D2 and spaced apart from each other.

The pad electrodes 470 may be disposed in the pad region 60. The pad electrodes 470 may be arranged in the first direction D1 and spaced apart from each other. Each of the pad electrodes 470 may include at least one of a metal, an alloy, metal nitride, conductive metal oxide, a transparent conductive material, and the like. The above-describe materials may be used alone or in combination with each other. In other embodiments, each of the pad electrodes 470 may have a multilayer structure including multiple metal layers. For example, the metal layers of each of the pad electrodes 470 may have mutually different thicknesses, or may include mutually different materials.

An external device 101 may be electrically connected to the display device 100 through a flexible printed circuit board (FPCB). For example, a side of the flexible printed circuit board (FPCB) may contact (e.g., directly contact) the pad electrodes 470, and an opposite side of the flexible printed circuit board (FPCB) may contact (e.g., directly contact) the external device 101. The external device 101 may generate a data signal DATA (e.g., refer to FIG. 4), a gate signal GW (e.g., refer to FIG. 4), an emission control signal EM (e.g., refer to FIG. 4), a gate initialization signal GI (e.g., refer to FIG. 4), an initialization voltage VINT (e.g., refer to FIG. 4), power supply voltages ELVDD and ELVSS (e.g., refer to FIG. 4), and the like. The data signal DATA (e.g., refer to FIG. 4), the gate signal, the emission control signal, the gate initialization signal GI, the initialization voltage VINT (e.g., refer to FIG. 4), the power supply voltage ELVDD and ELVSS (e.g., refer to FIG. 4), and the like may be provided to the sub-pixel SP through the flexible printed circuit board (FPCB). A driving integrated circuit may be mounted on the flexible printed circuit board (FPCB). In other embodiments, the driving integrated circuit may be mounted on the display device 100 and be adjacent to the pad electrodes 470. In other embodiments, the display device 100 and the external device 101 may be connected to each other by using a printed circuit board (PCB) or a flexible flat cable (FFC) instead of the flexible printed circuit board (FPCB).

Figure 4:
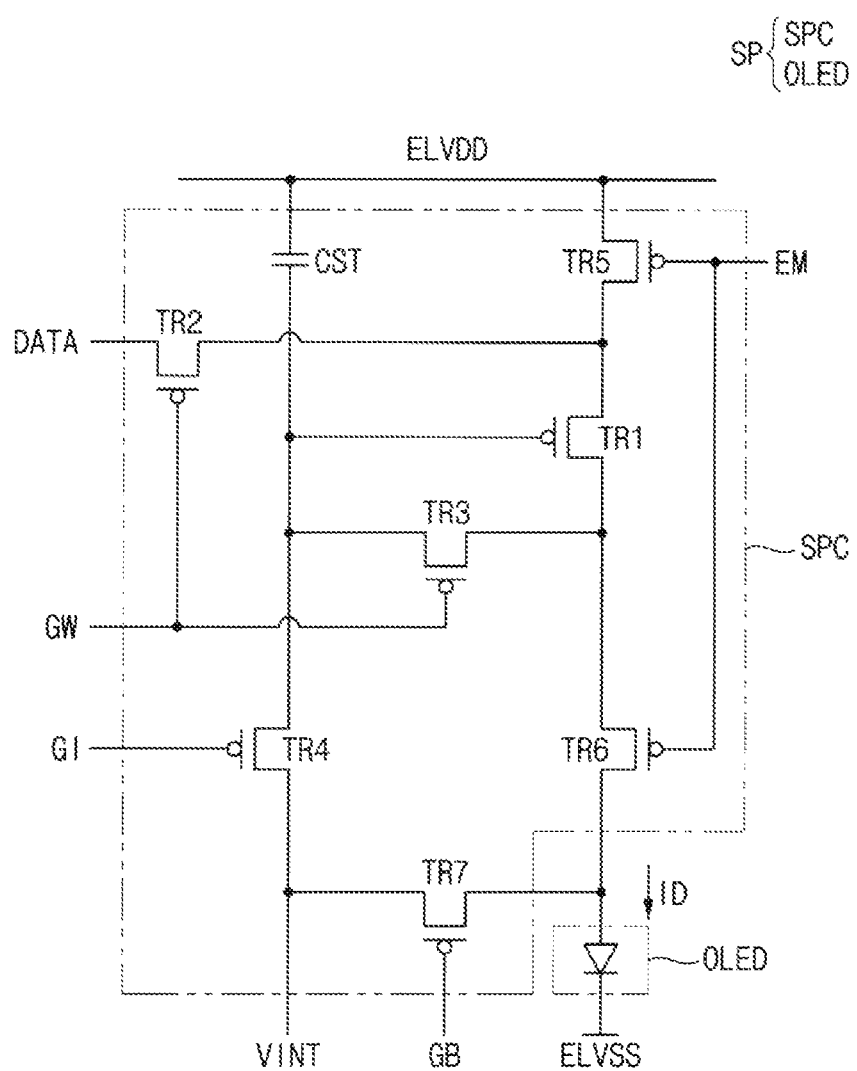
FIG. 4 is a schematic diagram of an equivalent circuit showing a sub-pixel circuit and an organic light emitting diode disposed in a sub-pixel region of FIG. 2.

FIG. 4 is a schematic diagram of an equivalent circuit showing a sub-pixel circuit and an organic light emitting diode disposed in a sub-pixel region of FIG. 2.

Referring to FIG. 4, the display device 100 may include a sub-pixel SP disposed in each of the first to third sub-pixel regions 11, 12, and 13 (e.g., refer to FIG. 2). The sub-pixel SP may include a sub-pixel circuit SPC and an organic light emitting diode OLED (e.g., a sub-pixel structure 200 of FIG. 5). The sub-pixel circuit SPC may include first to seventh transistors TR1, TR2, TR3, TR4, TR5, TR6, and TR7 (e.g., a semiconductor element 250 of FIG. 5), a storage capacitor CST, and the like. The sub-pixel circuit SPC or the organic light emitting diode OLED may be electrically connected to various wires, such as a wire to which a first power supply voltage ELVDD is applied, a wire to which a second power supply voltage ELVSS is applied, an auxiliary wire to which the second power supply voltage ELVSS is applied, a wire to which an initialization voltage VINT is applied, a wire to which a data signal DATA is applied, a wire to which a gate signal GW is applied, a wire to which a gate initialization signal GI is applied, a wire to which an emission control signal EM is applied, a wire to which a diode initialization signal GB is applied, and the like. As described above, the first transistor TR1 may correspond to a driving transistor, and the second to seventh transistors TR2, TR3, TR4, TR5, TR6, and TR7 may correspond to switching transistors. Each of the first to seventh transistors TR1, TR2, TR3, TR4, TR5, TR6, and TR7 may include a first terminal, a second terminal, a channel, and a gate terminal. According to the embodiments, the first terminal may be a source terminal, and the second terminal may be a drain terminal. In other embodiments, the first terminal may be a drain terminal, and the second terminal may be a source terminal.

The organic light emitting diode OLED may output a light based on a driving current ID. The organic light emitting diode OLED may include a first terminal and a second terminal. According to the embodiments, the second terminal of the organic light emitting diode OLED may receive the second power supply voltage ELVSS, and the first terminal of the organic light emitting diode OLED may receive the first power supply voltage ELVDD. For example, the first terminal of the organic light emitting diode OLED may be an anode terminal, and the second terminal of the organic light emitting diode OLED may be a cathode terminal. In other embodiments, the first terminal of the organic light emitting diode OLED may be a cathode terminal, and the second terminal of the organic light emitting diode OLED may be an anode terminal. According to the embodiments, the anode terminal of the organic light emitting diode OLED may correspond to a lower electrode 290 (e.g., refer to FIG. 5), and the cathode terminal of the organic light emitting diode OLED may correspond to an upper electrode 340 (e.g., refer to FIG. 5). According to the embodiments, the auxiliary wire 650 may be electrically connected to the upper electrode 340.

The first transistor TR1 may generate the driving current ID. According to the embodiments, the first transistor TR1 may operate in a saturation region. The first transistor TR1 may generate the driving current ID based on a voltage difference between a gate terminal and a source terminal of the first transistor TR1. Gray levels may be expressed based on a magnitude of the driving current ID supplied to the organic light emitting diode OLED. In other embodiments, the first transistor TR1 may operate in a linear region. The gray levels may be expressed based on the summation of a time during which the driving current is supplied to the organic light emitting diode OLED within a frame.

A gate terminal of the second transistor TR2 may receive the gate signal GW. A first terminal of the second transistor TR2 may receive the data signal DATA. A second terminal of the second transistor TR2 may be electrically connected to the first terminal of the first transistor TR1. The second transistor TR2 may supply the data signal DATA to the first terminal of the first transistor TR1 during an activation period of the gate signal GW. The second transistor TR2 may operate in a linear region.

A gate terminal of the third transistor TR3 may receive the gate signal GW. A first terminal of the third transistor TR3 may be electrically connected to the gate terminal of the first transistor TR1. A second terminal of the third transistor TR3 may be electrically connected to the second terminal of the first transistor TR1. The third transistor TR3 may electrically connect the gate terminal of the first transistor TR1 to the second terminal of the first transistor TR1 during the activation period of the gate signal GW.

A gate terminal of the fourth transistor TR4 may receive the gate initialization signal GI. A first terminal of the fourth transistor TR4 may receive the initialization voltage VINT. A second terminal of the fourth transistor TR4 may be electrically connected to the gate terminal of the first transistor TR1. The fourth transistor TR4 may supply the initialization voltage VINT to the gate terminal of the first transistor TR1 during an activation period of the gate initialization signal GI. The fourth transistor TR4 may operate in a linear region. The fourth transistor TR4 may initialize the gate terminal of the first transistor TR1 to the initialization voltage VINT during the activation period of the gate initialization signal GI. According to the embodiments, the initialization voltage VINT may have a voltage level that is lower (e.g., sufficiently lower) than a voltage level of the data signal DATA maintained by the storage capacitor CST in a previous frame, and the initialization voltage VINT may be supplied to the gate terminal of the first transistor TR1. In other embodiments, the initialization voltage may have a voltage level that is higher (e.g., sufficiently higher) than the voltage level of the data signal maintained by the storage capacitor in the previous frame, and the initialization voltage may be applied to the gate terminal of the first transistor. According to the embodiments, the gate initialization signal GI may be substantially the same as the gate signal GW of a horizontal time before.

A gate terminal of the fifth transistor TR5 may receive the emission control signal EM. A first terminal of the fifth transistor TR5 may receive the first power supply voltage ELVDD. A second terminal of the fifth transistor TR5 may be electrically connected to the first terminal of the first transistor TR1. The fifth transistor TR5 may supply the first power supply voltage ELVDD to the first terminal of the first transistor TR1 during an activation period of the emission control signal EM. On the contrary, the fifth transistor TR5 may cut off the supply of the first power supply voltage ELVDD during an inactivation period of the emission control signal EM. The fifth transistor TR5 may operate in a linear region. Since the fifth transistor TR5 supplies the first power supply voltage ELVDD to the first terminal of the first transistor TR1 during the activation period of the emission control signal EM, the first transistor TR1 may generate the driving current ID. Since the fifth transistor TR5 cuts off the supply of the first power supply voltage ELVDD during the inactivation period of the emission control signal EM, the data signal DATA supplied to the first terminal of the first transistor TR1 may be supplied to the gate terminal of the first transistor TR1.

A gate terminal of the sixth transistor TR6 (e.g., semiconductor element 250 of FIG. 5) may receive the emission control signal EM. A first terminal of the sixth transistor TR6 may be electrically connected to the second terminal of the first transistor TR1. A second terminal of the sixth transistor TR6 may be electrically connected to the first terminal of the organic light emitting diode OLED. The sixth transistor TR6 may supply the driving current ID generated by the first transistor TR1 to the organic light emitting diode OLED during the activation period of the emission control signal EM. The sixth transistor TR6 may operate in a linear region. Since the sixth transistor TR6 supplies the driving current ID generated by the first transistor TR1 to the organic light emitting diode OLED during the activation period of the emission control signal EM, the organic light emitting diode OLED may output the light. Since the sixth transistor TR6 electrically separates (or insulates) the first transistor TR1 and the organic light emitting diode OLED from each other during the inactivation period of the emission control signal EM, the data signal DATA supplied to the second terminal of the first transistor TR1 (e.g., data signal that has been subject to threshold voltage compensation) may be supplied to the gate terminal of the first transistor TR1.

A gate terminal of the seventh transistor TR7 may receive the diode initialization signal GB. A first terminal of the seventh transistor TR7 may receive the initialization voltage VINT. A second terminal of the seventh transistor TR7 may be electrically connected to the first terminal of the organic light emitting diode OLED. The seventh transistor TR7 may supply the initialization voltage VINT to the first terminal of the organic light emitting diode OLED during an activation period of the diode initialization signal GB. The seventh transistor TR7 may operate in a linear region. The seventh transistor TR7 may initialize the first terminal of the organic light emitting diode OLED to the initialization voltage VINT during the activation period of the diode initialization signal GB. In other embodiments, the gate initialization signal GI and the diode initialization signal GB may be substantially a same signal.

The storage capacitor CST may include a first terminal and a second terminal. The storage capacitor CST may be electrically connected between a first power supply voltage (ELVDD) wire and the gate terminal of the first transistor TR1. For example, the first terminal of the storage capacitor CST may be electrically connected to the gate terminal of the first transistor TR1, and the second terminal of the storage capacitor CST may receive the first power supply voltage ELVDD. The storage capacitor CST may maintain a voltage level of the gate terminal of the first transistor TR1 during an inactivation period of the gate signal GW. The inactivation period of the gate signal GW may include the activation period of the emission control signal EM. The driving current ID generated by the first transistor TR1 may be supplied to the organic light emitting diode OLED during the activation period of the emission control signal EM. Therefore, the driving current ID generated by the first transistor TR1 may be supplied to the organic light emitting diode OLED based on the voltage level maintained by the storage capacitor CST.

Although the sub-pixel circuit SPC according to the disclosure has been described as including seven transistors and one storage capacitor, the configuration of the disclosure is not limited thereto. For example, the sub-pixel circuit SPC may have a configuration including at least one transistor and at least one storage capacitor.

Figure 5:
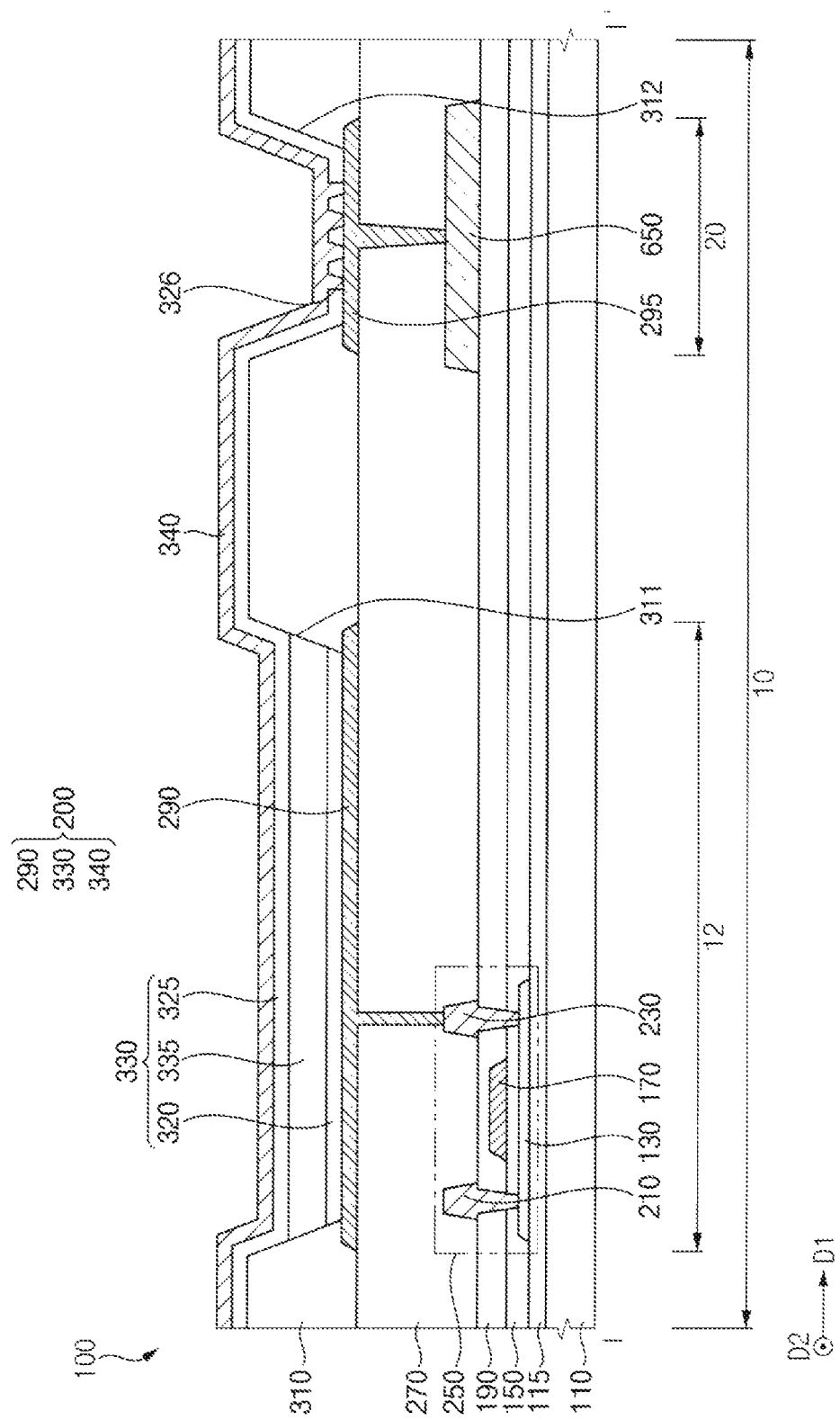
FIG. 5 is a schematic cross-sectional view taken along line I-I' of FIG. 2.
Figure 6:
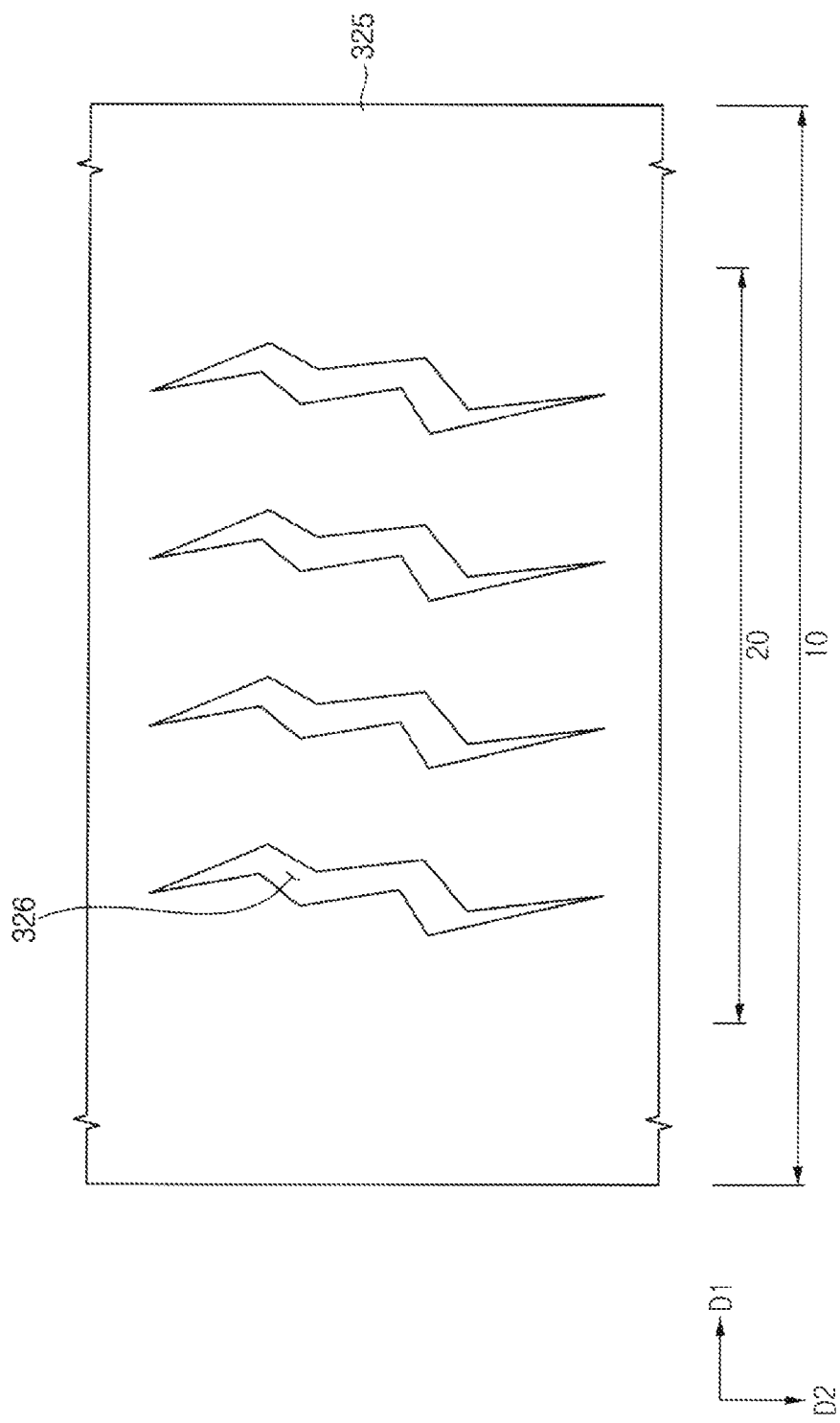
FIG. 6 is a schematic plan view for describing openings formed in an upper common layer of FIG. 5.
Figure 7:
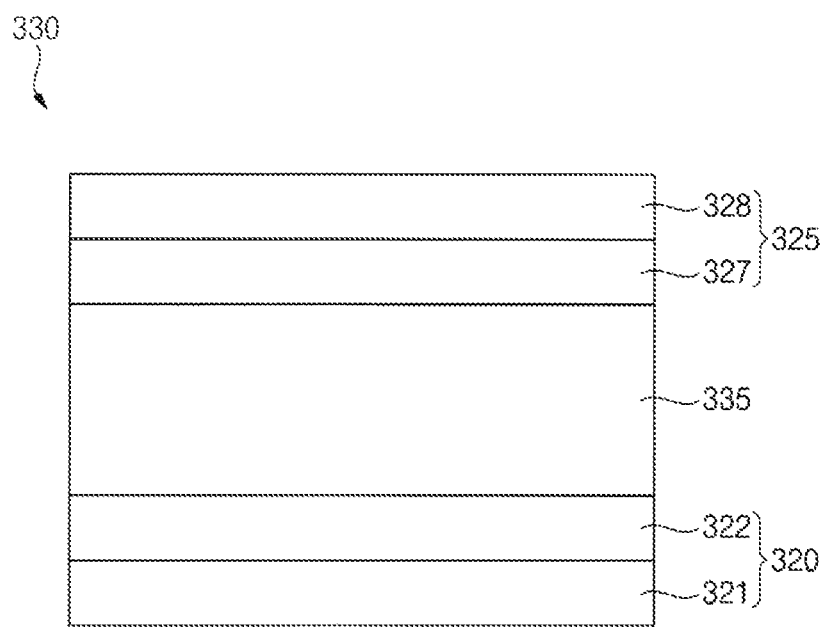
FIG. 7 is a schematic cross-sectional view for describing a light emitting layer of FIG. 5.

FIG. 5 is a schematic cross-sectional view taken along line I-I' of FIG. 2, and FIG. 6 is a schematic plan view for describing openings formed in an upper common layer of FIG. 5. FIG. 7 is a schematic cross-sectional view for describing a light emitting layer of FIG. 5.

Referring to FIGS. 5 to 7, the display device 100 may include a substrate 110, a buffer layer 115, a semiconductor element 250, an auxiliary wire 650, a planarization layer 270, a connection pattern 295, a sub-pixel structure 200, a pixel defining layer 310, and the like. The semiconductor element 250 may include an active layer 130, a gate insulating layer 150, a gate electrode 170, an interlayer insulating layer 190, a source electrode 210, and a drain electrode 230. The sub-pixel structure 200 may include a lower electrode 290, a light emitting structure 330, and an upper electrode 340. The light emitting structure 330 may include a lower common layer 320, a light emitting layer 335, and an upper common layer 325. The lower common layer 320 may include a hole injection layer 321 and a hole transport layer 322. The upper common layer 325 may include an electron transport layer 327 and an electron injection layer 328. According to the embodiments, the upper common layer 325 located in the contact region 20 may include openings (e.g., fine openings) 326. For example, the fine openings 326 may be formed through a portion of the upper common layer 325, which is located in the contact region 20.

The substrate 110 may include transparent materials. The substrate 110 may be configured as or implemented with, for example, a transparent resin substrate having flexibility. For example, the substrate 110 may have a configuration in which a first organic layer, a first barrier layer, a second organic layer, and a second barrier layer are sequentially stacked. Each of the first barrier layer and the second barrier layer of the substrate 110 may include an inorganic material such as silicon oxide, and may block water and/or moisture penetrating through the first and second organic layers. Each of the first organic layer and the second organic layer of the substrate 110 may include an organic insulating material having flexibility, such as a polyimide-based resin.

In other embodiments, the substrate 110 may include a quartz substrate, a synthetic quartz substrate, a calcium fluoride substrate, a fluorine-doped quartz substrate (F-doped quartz substrate), a soda lime glass substrate, a non-alkali glass substrate, or the like.

Since the display device 100 includes the first to third sub-pixel regions 11 (e.g., refer to FIG. 2), 12, and 13 (e.g., refer to FIG. 2) and the contact region 20, the substrate 110 may also be divided into the first to third sub-pixel regions 11 (e.g., refer to FIG. 2), 12, and 13 (e.g., refer to FIG. 2) and the contact region 20.

Although the substrate 110 has been described as having four layers (e.g., first organic layer, first barrier layer, second organic layer, and second barrier layer), the configuration of the substrate 110 is not limited thereto. For example, in other embodiments, the substrate 110 may include a single layer or multiple layers.

The buffer layer 115 may be disposed in the display region 10 on the substrate 110. For example, the buffer layer 115 may prevent metal atoms or impurities from diffusing from the substrate 110 to the semiconductor element 250. In case that a surface of the substrate 110 is not uniform, the buffer layer 115 may improve flatness of (or planarize) the surface of the substrate 110. Depending on a type of the substrate 110, at least two buffer layers 115 may be provided on the substrate 110, or the buffer layer 115 may not be provided. For example, the buffer layer 115 may include a silicon compound, metal oxide, a combination thereof, and the like. The buffer layer 115 may include at least one of silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like.

The active layer 130 may be disposed in the second sub-pixel region 12 on the buffer layer 115. The active layer 130 may include a metal oxide semiconductor, an inorganic semiconductor (e.g., amorphous silicon or polysilicon), an organic semiconductor, a combination thereof, or the like. The active layer 130 may include a source region, a drain region, and a channel region. The channel region of the active layer 130 may be located between the source region and the drain region.

The gate insulating layer 150 may be disposed in the display region 10 on the active layer 130. For example, the gate insulating layer 150 may sufficiently cover (or overlap) the active layer 130 on the buffer layer 115, and may have a substantially flat top surface without creating a step (or thickness or height difference) around the active layer 130. In other embodiments, the gate insulating layer 150 may be disposed along a profile of the active layer 130 with a uniform thickness to cover the active layer 130 on the buffer layer 115. The gate insulating layer 150 may include a silicon compound, metal oxide, a combination thereof, and the like. In other embodiments, the gate insulating layer 150 may have a multilayer structure including multiple insulating layers. The insulating layers of the gate insulating layer 150 may include mutually different materials, and may have mutually different thicknesses.

The gate electrode 170 may be disposed in the second sub-pixel region 12 on the gate insulating layer 150. The gate electrode 170 may be disposed on a portion of the gate insulating layer 150 under which the active layer 130 is located. For example, the gate electrode 170 may overlap the channel region of the active layer 130 (e.g., in a plan view). The gate electrode 170 may include a metal, an alloy, metal nitride, conductive metal oxide, a transparent conductive material, and the like. The above-described materials may be used alone or in combination with each other. In other embodiments, the gate electrode 170 may have a multilayer structure including multiple metal layers. The metal layers may include mutually different materials, and may have mutually different thicknesses.

The interlayer insulating layer 190 may be disposed in the display region 10 on the gate electrode 170. For example, the interlayer insulating layer 190 may cover (e.g., sufficiently cover) the gate electrode 170 on the gate insulating layer 150, and may have a substantially flat top surface without creating a step around the gate electrode 170. In other embodiments, the interlayer insulating layer 190 may be disposed along a profile of the gate electrode 170 with a uniform thickness to cover the gate electrode 170 on the gate insulating layer 150. The interlayer insulating layer 190 may include a silicon compound, metal oxide, a combination thereof, and the like. In other embodiments, the interlayer insulating layer 190 may have a multilayer structure including multiple insulating layers. The insulating layers may include mutually different materials, and may have mutually different thicknesses.

The source electrode 210 and the drain electrode 230 may be disposed in the second sub-pixel region 12 on the interlayer insulating layer 190. The source electrode 210 may be electrically connected to the source region of the active layer 130 through a contact hole formed by removing a first portion of the gate insulating layer 150 and a first portion of the interlayer insulating layer 190. The drain electrode 230 may be electrically connected to the drain region of the active layer 130 through a contact hole formed by removing a second portion of the gate insulating layer 150 and a second portion the interlayer insulating layer 190. Each of the source electrode 210 and the drain electrode 230 may include a metal, an alloy, metal nitride, conductive metal oxide, a transparent conductive material, and the like. The above-described materials may be used alone or in combination with each other. In other embodiments, each of the source electrode 210 and the drain electrode 230 may have a multilayer structure including multiple metal layers. The metal layers may include mutually different materials, and may have mutually different thicknesses.

Accordingly, the semiconductor element 250 including the active layer 130, the gate insulating layer 150, the gate electrode 170, the interlayer insulating layer 190, the source electrode 210, and the drain electrode 230 may be provided (e.g., provided on buffer layer 115 or substrate 110).

Although the semiconductor element 250 has been described as having a top gate structure, the configuration of the disclosure is not limited thereto. For example, the semiconductor element 250 may have a bottom gate structure, a double gate structure, or the like.

Although the display device 100 has been described as including one semiconductor element, the configuration of the disclosure is not limited thereto. For example, the display device 100 may include at least one semiconductor element and at least one storage capacitor.

The auxiliary wire 650 may be disposed in the contact region 20 on the interlayer insulating layer 190. For example, the auxiliary wire 650 may have a width in the first direction D1, and may extend in the second direction D2. The auxiliary wire 650 may function as a wire extending in the second direction D2 on the interlayer insulating layer 190. As described above, the second power supply voltage ELVSS (e.g., refer to FIG. 4) may be provided to the auxiliary wire 650, and the auxiliary wire 650 may be electrically connected to the upper electrode 340 through the connection pattern 295 and the fine openings 326 of the upper common layer 325. For example, as a size of the display device 100 increases, a size of the display region 10 may also be increased. In case that the size of the display region 10 is increased, a voltage drop (IR drop) may be caused in the upper electrode 340. In order to remove the voltage drip (IR drop), the auxiliary wire 650 to which the second power supply voltage ELVSS is provided may be disposed in the display region 10, and the auxiliary wire 650 may be electrically connected to the upper electrode 340 in the contact region 20. Thus, the auxiliary wire 650 may additionally provide the second power supply voltage ELVSS to the upper electrode 340. Accordingly, since the second power supply voltage ELVSS is additionally provided to the upper electrode 340, the voltage drop may not be caused in the display device 100.

The auxiliary wire 650 may include a metal, an alloy, metal nitride, conductive metal oxide, a transparent conductive material, a combination thereof, and the like. For example, the auxiliary wire 650 may include at least one of gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and the like. The above-described materials may be used alone or in combination with each other. According to the embodiments, the auxiliary wire 650 may be located on the same layer as the source electrode 210 and the drain electrode 230. In other embodiments, the auxiliary wire 650 may have a multilayer structure including multiple metal layers. The metal layers may include mutually different materials, and may have mutually different thicknesses.

Although the auxiliary wire 650 according to the disclosure has been described as being located on the same layer as the source electrode 210 and the drain electrode 230, the configuration of the disclosure is not limited thereto. For example, the auxiliary wire 650 may be located on the same layer as the gate electrode 170, or located on the same layer as the active layer 130. In other embodiments, the auxiliary wire 650 may be disposed between the buffer layer 115 and the substrate 110, or may be embedded in the substrate 110.

The planarization layer 270 may be disposed on the interlayer insulating layer 190, the semiconductor element 250, and the auxiliary wire 650. The planarization layer 270 may be disposed between the substrate 110 and the light emitting layer 335. The planarization layer 270 may have a thick thickness (e.g., thicker than other insulating layers). The planarization layer 270 may be formed of an organic insulating material or an inorganic insulating material. According to the embodiments, the planarization layer 270 may include an organic insulating material. For example, the planarization layer 270 may include at least one of a photoresist, a polyacryl-based resin, a polyimide-based resin, a polyamide-based resin, a siloxane-based resin, an acryl-based resin, an epoxy-based resin, and the like.

The lower electrode 290 may be disposed in the second sub-pixel region 12 on the planarization layer 270. The lower electrode 290 may be disposed in the second sub-pixel region 12 between the substrate 110 and the light emitting layer 335. For example, the lower electrode 290 may have an island shape, and may be substantially disposed only in the second sub-pixel region 12. The lower electrode 290 may be electrically connected to the drain electrode 230 through a contact hole formed in a first portion of the planarization layer 270. The lower electrode 290 may be electrically connected to the semiconductor element 250. The lower electrode 290 may include a metal, an alloy, metal nitride, conductive metal oxide, a transparent conductive material, and the like. The above-described materials may be used alone or in combination with each other. In other embodiments, the lower electrode 290 may have a multi-layer structure including multiple metal layers. The metal layers of the lower electrode 290 may include mutually different materials, and may have mutually different thicknesses. For example, the lower electrode 290 may have a stacked structure of ITO/Ag/ITO.

The connection pattern 295 may be disposed in the contact region 20 on the planarization layer 270. For example, the connection pattern 295 may have an island shape, and may be disposed only in the contact region 20. The connection pattern 295 may be electrically connected to the auxiliary wire 650 through a contact hole formed in a second portion of the planarization layer 270, and the contact hole formed in the second portion may be located in the contact region 20. The connection pattern 295 may be electrically connected to the auxiliary wire 650. The connection pattern 295 may include a metal, an alloy, metal nitride, conductive metal oxide, a transparent conductive material, and the like. The above-described materials may be used alone or in combination with each other. According to the embodiments, the connection pattern 295 and the lower electrode 290 may be located on a same layer. In other embodiments, the connection pattern 295 may have a multilayer structure including multiple metal layers. The metal layers of the connection pattern 295 may include mutually different materials, and may have mutually different thicknesses.

The pixel defining layer 310 may be disposed on the planarization layer 270. The pixel defining layer 310 may be disposed between the substrate 110 and the upper electrode 340. The pixel defining layer 310 may include a first opening 311 formed in the second sub-pixel region 12 and a second opening 312 formed in the contact region 20. According to the embodiments, in a cross-sectional view of the display device 100, the pixel defining layer 310 may cover (or overlap) side portions (e.g., both side portions) of the lower electrode 290, and expose a portion (e.g., central portion) of a top surface of the lower electrode 290. In a plan view of the display device 100, the pixel defining layer 310 may overlap an outermost periphery of the lower electrode 290 in a plan view. In a cross-sectional view of the display device 100, the pixel defining layer 310 may cover side portions (e.g., both side portions) of the connection pattern 295, and expose a portion (e.g., central portion) of a top surface of the connection pattern 295. In a plan view of the display device 100, the pixel defining layer 310 may overlap an outermost periphery of the connection pattern 295 in a plan view. The pixel defining layer 310 may be formed of an organic insulating material or an inorganic insulating material. According to the embodiments, the pixel defining layer 310 may include an organic insulating material.

The lower common layer 320 may be disposed on the lower electrode 290. The lower common layer 320 may be located in the first opening 311 of the pixel defining layer 310. The lower common layer 320 may be disposed in the second sub-pixel region 12 between the lower electrode 290 and the light emitting layer 335. According to the embodiments, the lower common layer 320 may be disposed only in the second sub-pixel region 12, and may not be disposed in the contact region 20. As shown in FIG. 7, the lower common layer 320 may include a hole injection layer (HIL) 321 and a hole transport layer (HTL) 322. The hole injection layer 321 may be disposed on the lower electrode 290. The hole transport layer 322 may be disposed on the hole injection layer 321. In other embodiments, only one of the hole injection layer 321 and the hole transport layer 322 may be disposed on the lower electrode 290.

For example, the hole injection layer 321 may include a hole injection material such as (N-carbazolyl)triphenylamine (TCTA) or 4,4',4"-tris[3-methylphenyl(phenyl)amino]triphenylamine (m-MTDATA), and the hole transport layer 322 may include a hole transport material such as 4,4'-bis[N-(1-naphthyl)-N-phenylamino]biphenyl (NPB), 4,4'-bis[N-(3-methylphenyl)-N-phenylamino]biphenyl (TPD), N,N'-di-1-naphthyl-N,N'-diphenyl-1,1'-biphenyl-4,4'-diamine (NPD), N-phenylcarbazole, or polyvinylcarbazole. The lower common layer 320 including the hole injection layer 321 and the hole transport layer 322 may include an organic material.

Referring again to FIG. 5, the light emitting layer 335 may be disposed on the lower common layer 320. The light emitting layer 335 may be located in the first opening 311 of the pixel defining layer 310. The light emitting layer 335 may be disposed in the second sub-pixel region 12 on the substrate 110. According to the embodiments, the light emitting layer 335 may be disposed only in the second sub-pixel region 12, and may not be disposed in the contact region 20. The light emitting layer 335 may be formed by using at least one of light emitting materials for emitting different color lights (i.e., red light, green light, blue light, or the like) according to sub-pixels. For example, the light emitting layer 335 disposed in the first sub-pixel region 11 may include a red light emitting material. The light emitting layer 335 disposed in the second sub-pixel region 12 may include a green light emitting material. The light emitting layer 335 disposed in the third sub-pixel region 13 may include a blue light emitting material. According to the embodiments, the light emitting layer 335 may be an organic light emitting layer including an organic light emitting material. In other embodiments, the light emitting layer 335 may be formed by stacking light emitting materials for generating different color lights such as the red light, the green light, the blue light, or the like to emit a white light as a whole. A color filter (not illustrated) may be disposed on the light emitting layer 335 configured to emit the white light. The color filter (not illustrated) may include at least one of a red color filter, a green color filter, and a blue color filter. In some embodiments, the color filter (not illustrated) may include a yellow color filter, a cyan color filter, and a magenta color filter. The color filter (not illustrated) may include a photosensitive resin or a color photoresist.

The upper common layer 325 may be disposed on the light emitting layer 335, the pixel defining layer 310, and the connection pattern 295. The upper common layer 325 may be located in both of the first opening 311 and the second opening 312 of the pixel defining layer 310. The upper common layer 325 may be disposed over the whole display region 10 on the substrate 110.

According to the embodiments, as shown in FIGS. 5 and 6, the upper common layer 325 disposed in the contact region 20 may include the fine openings 326 that expose the top surface of the connection pattern 295. For example, the fine openings 326 may be adjacent to a portion (e.g., overlapping portion) in which the connection pattern 295 and the upper electrode 340 overlap each other in a plan view. For example, according to a method of manufacturing the display device 100, after the upper electrode 340 is formed, a preset voltage (e.g., voltage difference) may be applied to the upper electrode 340 and the auxiliary wire 650. Since the upper common layer 325 has a thin thickness (e.g., approximately 200 angstroms or less), dielectric breakdown may be caused by heat, which is generated by a voltage applied between the upper electrode 340 and the connection pattern 295, in the upper common layer 325 located between the upper electrode 340 and the connection pattern 295. As shown in FIG. 6, cracks may be generated in the upper common layer 325 disposed in the contact region 20, and the cracks may be defined as the fine openings 326. The fine openings 326 may expose the top surface of the connection pattern 295. In the above-described process, a portion of the upper electrode 340 having the thin thickness may be melted to fill the fine openings 326, and the upper electrode 340 may contact (e.g., directly contact) the connection pattern 295. In some embodiments, ITO, which is an uppermost layer of the connection pattern 295 having a stacked structure of ITO/Ag/ITO, may also be melted by the heat to fill the fine openings 326.

As shown in FIG. 7, the upper common layer 325 may include an electron transport layer (ETL) 327 and an electron injection layer (EIL) 328. The electron transport layer 327 may be disposed on the light emitting layer 335, and the electron injection layer 328 may be disposed on the electron transport layer 327. In some embodiments, only one of the electron transport layer 327 and the electron injection layer 328 may be disposed on the light emitting layer 335.

For example, the electron transport layer 327 may include at least one electron transport material such as tris(8-quinolinolato)aluminum (Alq3), 2-(4-biphenylyl)-5-(4-tert-butylphenyl)-1,3,4-oxadiazole (PBD), bis(2-methyl-8-quinolinolato)-4-phenylphenolato-aluminum (BAlq), bathocuproine (BCP), triazole (TAZ), or phenylquinoxaline, and the electron injection layer 328 may include at least one of an electron injection material such as (N-carbazolyl) triphenylamine (TCTA), 4,4',4''-tris[3-methylphenyl(phenyl)amino]triphenylamine (m-MTDATA), lithium fluoride (LiF), and cesium fluoride (CsF). Each of the upper common layer 325 including the electron transport layer 327 and the electron injection layer 328 may include an organic material.

Accordingly, the light emitting structure 330 may include the lower common layer 320, the light emitting layer 335, and the upper common layer 325.

Although the upper common layer 325 according to the disclosure has been described as including three fine openings 326, the configuration of the disclosure is not limited thereto. For example, the upper common layer 325 may include at least one fine opening 326.

Although the fine openings 326 have been shown in FIG. 6 as having polygonal shapes in a plan view, the shapes of the fine openings 326 are not limited thereto. For example, the fine openings 326 may have various opening shapes through which the top surface of the connection pattern 295 is exposed.

Although the fine openings 326 have been described as being located only in the contact region 20, the configuration of the disclosure is not limited thereto. For example, the fine openings 326 may also be formed in the upper common layer 325 disposed in the display region 10 that is adjacent to the contact region 20.

Referring again to FIG. 5, the upper electrode 340 may be disposed on the upper common layer 325. The upper electrode 340 may contact (e.g., directly contact) the connection pattern 295 by passing through the fine openings 326. The upper electrode 340 may be disposed along a profile of the upper common layer 325. As described above, the second power supply voltage ELVSS may be applied to the upper electrode 340, and the upper electrode 340 may additionally receive the second power supply voltage ELVSS applied to the auxiliary wire 650 through the connection pattern 295. The upper electrode 340 may include a metal, an alloy, metal nitride, conductive metal oxide, a transparent conductive material, or the like. The above-described materials may be used alone or in combination with each other. According to the embodiments, the upper electrode 340 may include conductive metal oxide such as ITO. In other embodiments, the upper electrode 340 may have a multilayer structure including multiple metal layers. The metal layers of the upper electrode 340 may include mutually different materials, and may have mutually different thicknesses.

Accordingly, the sub-pixel structure 200 may include the lower electrode 290, the light emitting structure 330, and the upper electrode 340.

A thin film encapsulation structure (not illustrated) may be disposed on the upper electrode 340. The thin film encapsulation structure (not illustrated) may have a structure in which at least one inorganic insulating layer and at least one organic insulating layer are alternately stacked to improve flexibility of the display device 100. For example, the stacked structure of the thin film encapsulation structure (not illustrated) may include a first inorganic insulating layer, an organic insulating layer, and a second inorganic insulating layer. In other embodiments, an encapsulation substrate (not illustrated) may be disposed on the upper electrode 340. The encapsulation substrate (not illustrated) may include a quartz substrate, a synthetic quartz substrate, a calcium fluoride substrate, a fluorine-doped quartz substrate (F-doped quartz substrate), a soda lime glass substrate, a non-alkali glass substrate, or the like.

Since the display device 100 according to the embodiments of the disclosure includes the upper common layer 325 including the fine openings 326, the upper electrode 340 and the connection pattern 295 may be readily and electrically connected to each other. Accordingly, the voltage drop may not be caused in the display device 100.

Although the display device 100 according to the disclosure has been described as specifically being an organic light emitting diode display device, the configuration of the disclosure is not limited thereto. In other embodiments, the display device 100 may include a quantum dot display device (QDD), a liquid crystal display device (LCD), a field emission display device (FED), a plasma display device (PDP), an electrophoretic display device (EPD), or the like.

FIGS. 8 to 19 are schematic views showing a method of manufacturing a display device according to embodiments of the disclosure.

Figure 8:
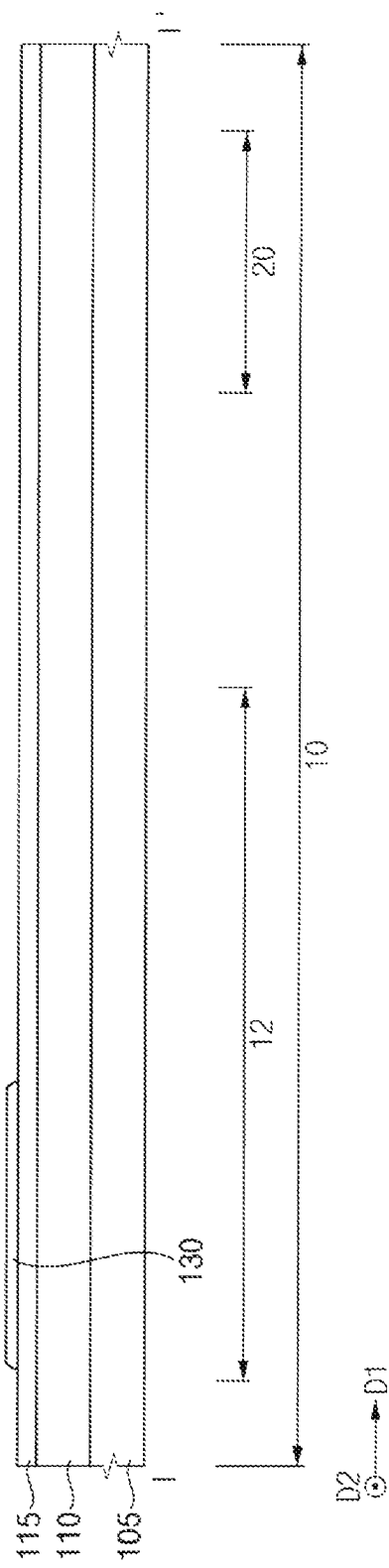
FIGS. 8 to 19 are schematic views showing a method of manufacturing a display device according to embodiments of the disclosure.

Referring to FIG. 8, a rigid glass substrate 105 may be provided. A substrate 110 including transparent materials may be formed on the glass substrate 105. The substrate 110 may be formed by using a transparent resin substrate having flexibility. For example, the substrate 110 may have a configuration in which a first organic layer, a first barrier layer, a second organic layer, and a second barrier layer are sequentially stacked. The first barrier layer and the second barrier layer of the substrate 110 may be formed by using an inorganic material such as silicon oxide. The first organic layer and the second organic layer of the substrate 110 may be formed by using an organic insulating material having flexibility, such as a polyimide-based resin. The substrate 110 may include a second sub-pixel region 12 and a contact region 20.

Since the substrate 110 is thin and flexible, the substrate 110 may be formed on the rigid glass substrate 105. For example, after performing a subsequent process, the glass substrate 105 may be removed from the substrate 110. Due to flexible physical properties of the substrate 110, it may be difficult to directly perform the subsequent process on the substrate 110 (e.g., subsequent process may not be readily performed on substrate 110). However, the subsequent process of the embodiment may be performed by using the rigid glass substrate 105, and the glass substrate 105 may be removed from the substrate 110. Thus, the first organic layer, the first barrier layer, the second organic layer, and the second barrier layer may be used as the substrate 110. In other embodiments, a silicon layer may be interposed between the first barrier layer and the second organic layer so that the first organic layer, the first barrier layer, the second organic layer, and the second barrier layer may not be separated (e.g., electrically separated or insulated) from each other in case that the glass substrate 105 is peeled off from the substrate 110.

In other embodiments, the substrate 110 may be formed by using a quartz substrate, a synthetic quartz substrate, a calcium fluoride substrate, a fluorine-doped quartz substrate, a soda lime glass substrate, a non-alkali glass substrate, or the like.

A buffer layer 115 may be formed in a display region 10 on the substrate 110. For example, the buffer layer 115 may prevent diffusion of metal atoms or impurities from the substrate 110. In case that a surface of the substrate 110 is not uniform, the buffer layer 115 may improve flatness of (or planarize) the surface of the substrate 110. The buffer layer 115 may be formed by using a silicon compound, metal oxide, a combination thereof, or the like. For example, the buffer layer 115 may include at least one of $SiO_x$, $SiN_x$, $SiO_xN_y$, $SiO_xC_y$, $SiC_xN_y$, $AlO_x$, $AlN_x$, $TaO_x$, $HfO_x$, $ZrO_x$, $TiO_x$, and the like.

The active layer 130 may be formed in the second sub-pixel region 12 on the buffer layer 115. The active layer 130 may be formed by using a metal oxide semiconductor, an inorganic semiconductor, an organic semiconductor, a combination thereof, or the like. The active layer 130 may include a source region, a drain region, and a channel region located between the source region and the drain region.

Figure 9:
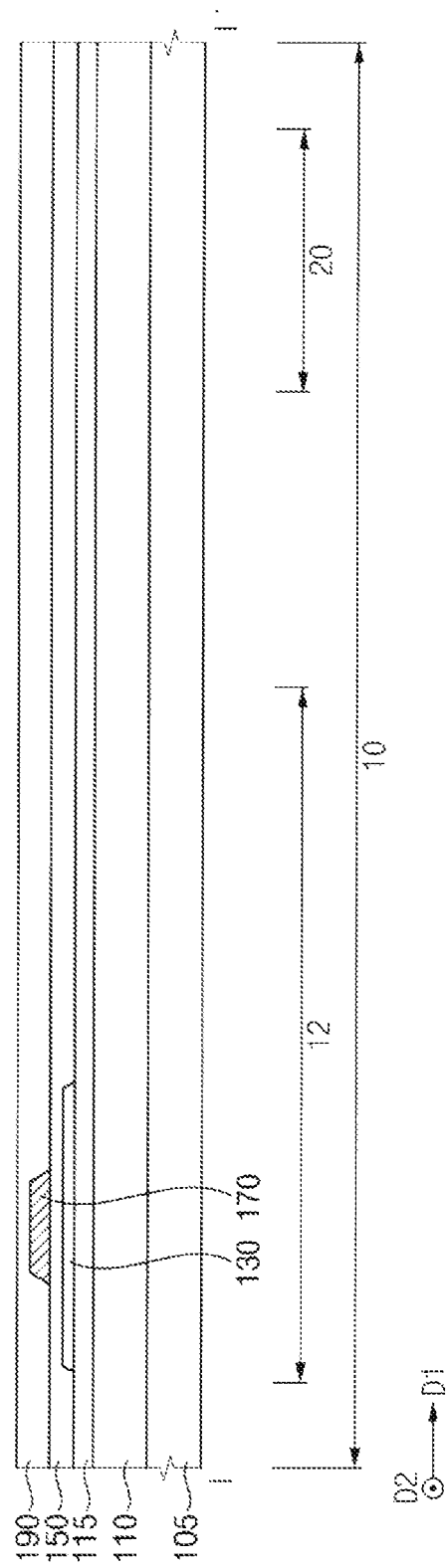

Referring to FIG. 9, a gate insulating layer 150 may be formed in the display region 10 on the active layer 130. For example, the gate insulating layer 150 may sufficiently cover (or overlap) the active layer 130 on the buffer layer 115, and may have a substantially flat top surface without creating a step around the active layer 130. In other embodiments, the gate insulating layer 150 may be formed along a profile of the active layer 130 with a uniform thickness to cover the active layer 130 on the buffer layer 115. The gate insulating layer 150 may be formed by using a silicon compound, metal oxide, a combination thereof, or the like.

A gate electrode 170 may be formed in the second sub-pixel region 12 on the gate insulating layer 150. The gate electrode 170 may be formed on a portion of the gate insulating layer 150 under which the active layer 130 is located. The gate electrode 170 may be formed by using a metal, an alloy, metal nitride, conductive metal oxide, a transparent conductive material, or the like. The above-described materials may be used alone or in combination with each other.

An interlayer insulating layer 190 may be formed in the display region 10 on the gate electrode 170. For example, the interlayer insulating layer 190 may sufficiently cover the gate electrode 170 on the gate insulating layer 150, and may have a substantially flat top surface without creating a step around the gate electrode 170. In other embodiments, the interlayer insulating layer 190 may be formed along a profile of the gate electrode 170 with a uniform thickness to cover the gate electrode 170 on the gate insulating layer 150. The interlayer insulating layer 190 may be formed by using a silicon compound, metal oxide, a combination thereof, or the like.

Figure 10:
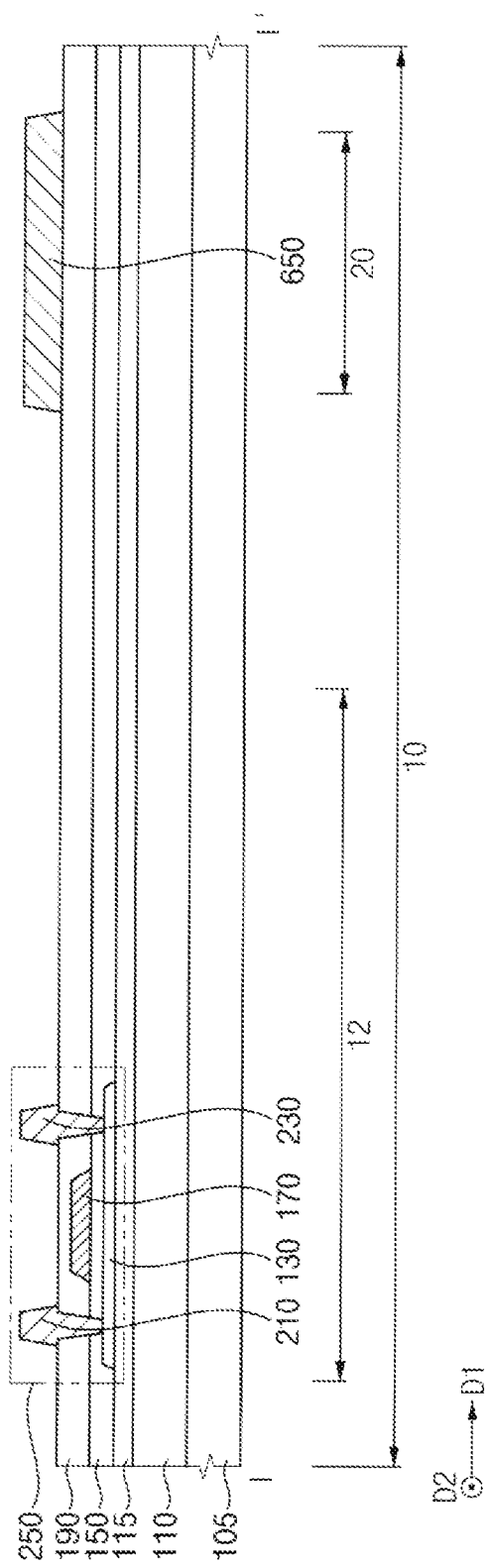

Referring to FIG. 10, a source electrode 210 and a drain electrode 230 may be formed in the second sub-pixel region 12 on the interlayer insulating layer 190. The source electrode 210 may be electrically connected to the source region of the active layer 130 through a contact hole formed by removing a first portion of the gate insulating layer 150 and a first portion of the interlayer insulating layer 190, and the drain electrode 230 may be electrically connected to the drain region of the active layer 130 through a contact hole formed by removing a second portion of the gate insulating layer 150 and a second portion of the interlayer insulating layer 190.

Accordingly, a semiconductor element 250 including the active layer 130, the gate insulating layer 150, the gate electrode 170, the interlayer insulating layer 190, the source electrode 210, and the drain electrode 230 may be formed.

An auxiliary wire 650 may be formed in the contact region 20 on the interlayer insulating layer 190. The auxiliary wire 650 may be formed in the contact region 20 on the substrate 110. For example, the auxiliary wire 650 may have a width in the first direction D1, and may extend in the second direction D2.

According to the embodiments, the auxiliary wire 650 may be simultaneously formed with the source electrode 210 and the drain electrode 230 on the same layer as the source electrode 210 and the drain electrode 230 by using the same material as the source electrode 210 and the drain electrode 230. For example, after a preliminary first electrode layer is formed over the whole interlayer insulating layer 190, the preliminary first electrode layer may be selectively etched, and the auxiliary wire 650, the source electrode 210, and the drain electrode 230 may be simultaneously formed. Each of the auxiliary wire 650, the source electrode 210, and the drain electrode 230 may be formed by using a metal, an alloy, metal nitride, conductive metal oxide, a transparent conductive material, a combination thereof, or the like. For example, each of the auxiliary wire 650, the source electrode 210, and the drain electrode 230 may include at least one of Au, Ag, Al, Pt, Ni, Ti, Pd, Mg, Ca, Li, Cr, Ta, W, Cu, Mo, Sc, Nd, Ir, an aluminum-containing alloy, $AlN_x$, a silver-containing alloy, $WN_x$, a copper-containing alloy, a molybdenum-containing alloy, $TiN_x$, $CrN_x$, $TaN_x$, $SrRu_xO_y$, $ZnO_x$, ITO, $SnO_x$, $InO_x$, $GaO_x$, IZO, and the like. The above-described materials may be used alone or in combination with each other.

Figure 11:
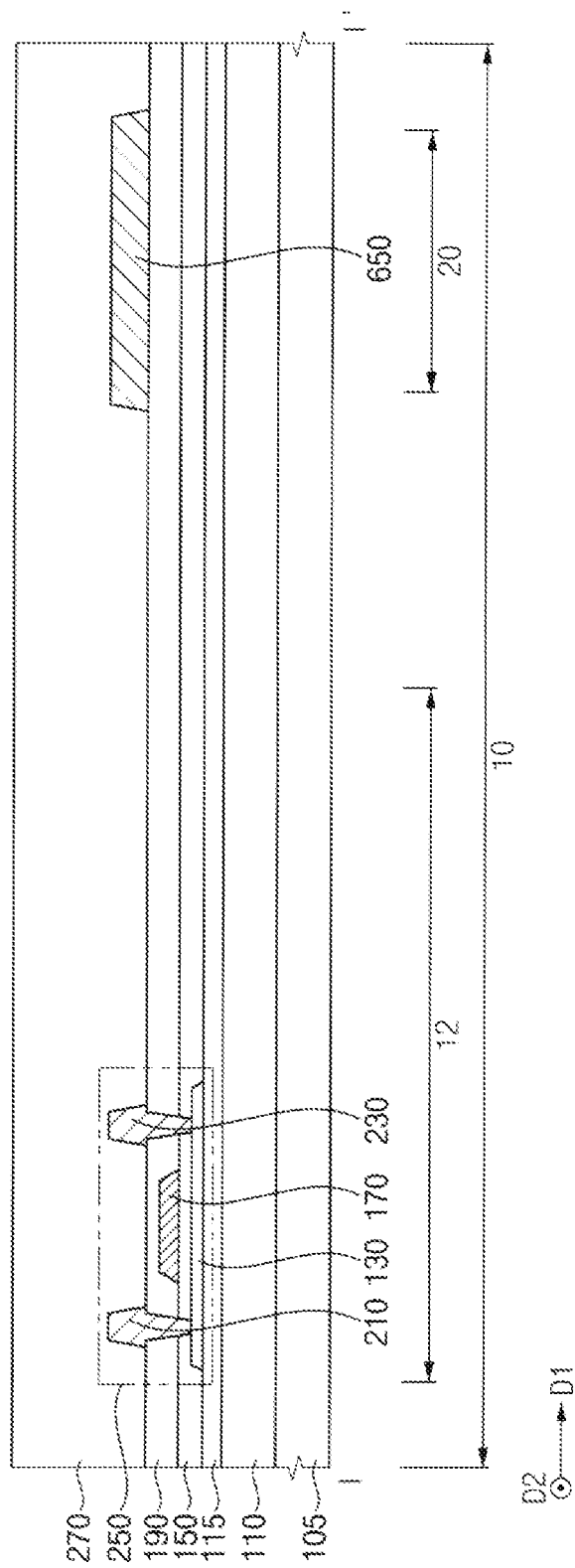

Referring to FIG. 11, a planarization layer 270 may be formed on the interlayer insulating layer 190, the semiconductor element 250, and the auxiliary wire 650. The planarization layer 270 may have a thick thickness, and the planarization layer 270 may have a substantially flat top surface. In order to implement the flat top surface of the planarization layer 270, a planarization process may be additionally performed on the planarization layer 270. The planarization layer 270 may be formed by using an organic insulating material. For example, the planarization layer 270 may include at least one of a photoresist, a polyacryl-based resin, a polyimide-based resin, a polyamide-based resin, a siloxane-based resin, an acryl-based resin, an epoxy-based resin, and the like.

Figure 12:
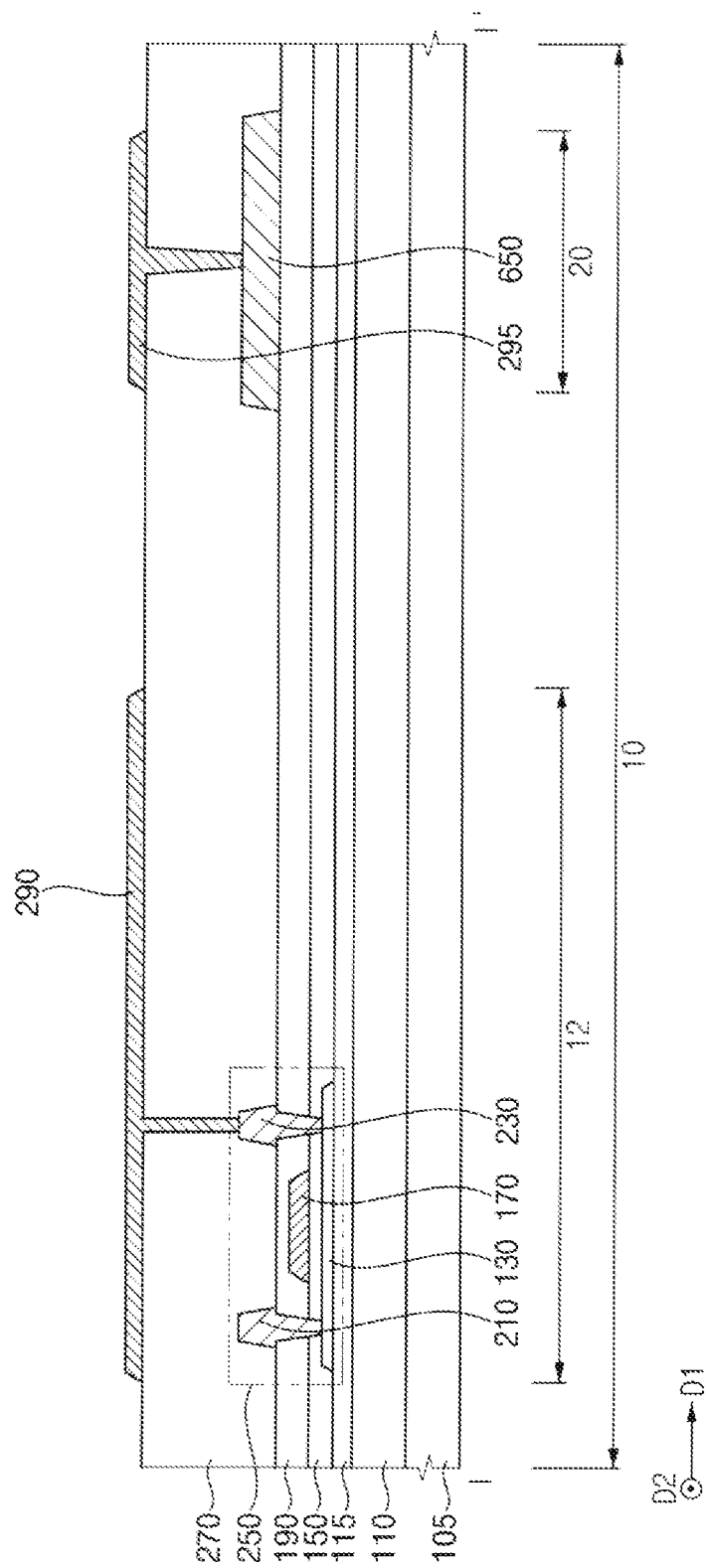

Referring to FIG. 12, a lower electrode 290 may be formed in the second sub-pixel region 12 on the planarization layer 270. For example, the lower electrode 290 may have an island shape, and may be substantially formed only in the second sub-pixel region 12. The lower electrode 290 may be electrically connected to the drain electrode 230 through a first contact hole formed in a first portion of the planarization layer 270.

A connection pattern 295 may be formed in the contact region 20 on the planarization layer 270. The connection pattern 295 may be formed on the auxiliary wire 650. For example, the connection pattern 295 may have an island shape, and may be formed only in the contact region 20. The connection pattern 295 may be electrically connected to the auxiliary wire 650 through a second contact hole formed in a second portion of the planarization layer 270, and the second contact hole may be located in the contact region 20.

According to the embodiments, the lower electrode 290 and the connection pattern 295 may be simultaneously formed on a same layer by using a same material. For example, after the first and second contact holes are formed in the planarization layer 270, a preliminary second electrode layer may be formed over the whole planarization layer 270. After the preliminary second electrode layer is formed, the preliminary second electrode layer may be selectively etched, and the lower electrode 290 and the connection pattern 295 may be simultaneously formed. Each of the lower electrode 290 and the connection pattern 295 may be formed by using a metal, an alloy, metal nitride, conductive metal oxide, a transparent conductive material, a combination thereof, or the like. According to the embodiments, each of the lower electrode 290 and the connection pattern 295 may have a stacked structure (e.g., triple layers) of ITO/Ag/ITO.

Figure 13:
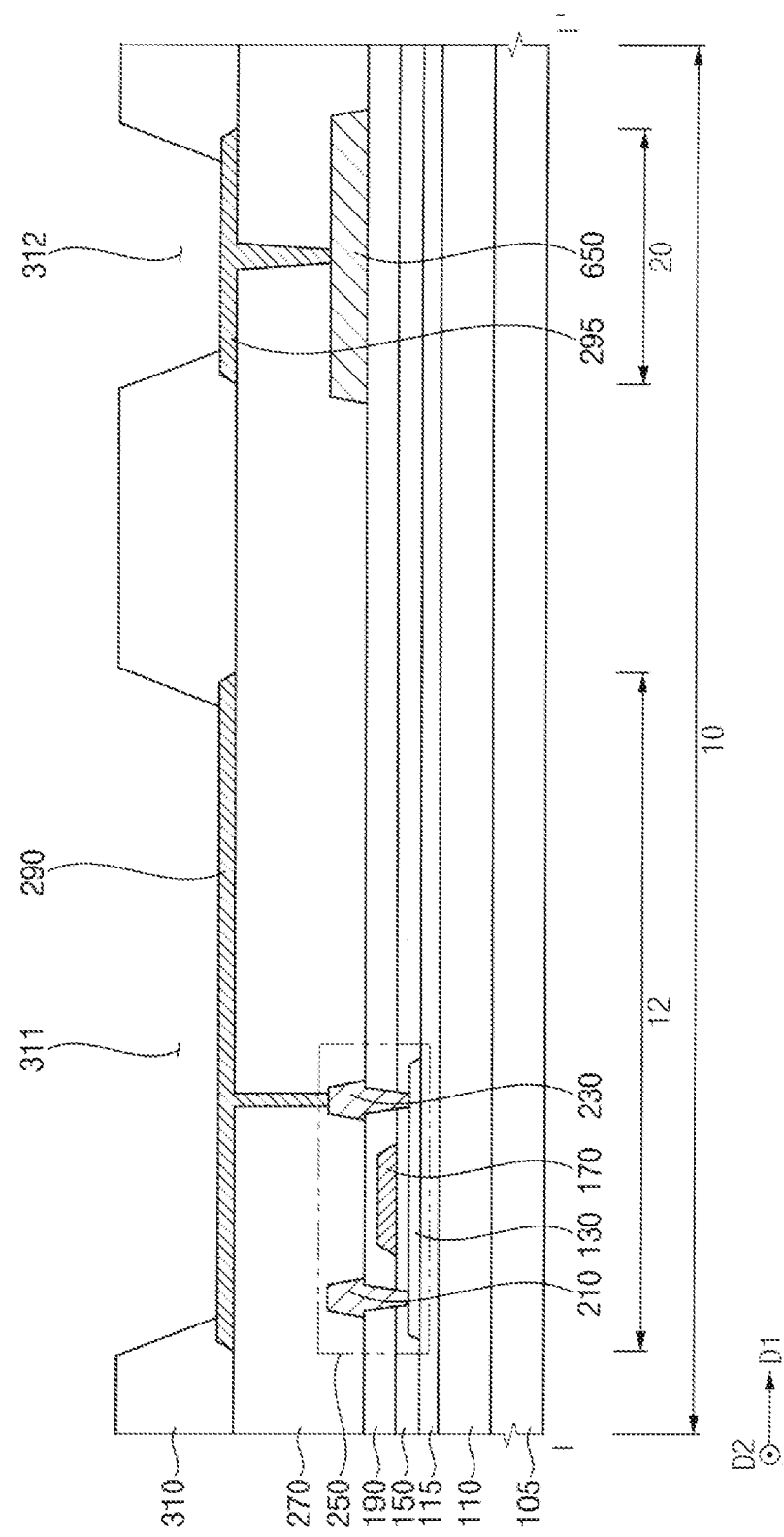

Referring to FIG. 13, a pixel defining layer 310 may be formed on the planarization layer 270. A first opening 311 located in the second sub-pixel region 12 and a second opening 312 located in the contact region 20 may be formed in the pixel defining layer 310. The pixel defining layer 310 may cover side portions (e.g., both side portions) of the lower electrode 290, and a portion (e.g., central portion) of a top surface of the lower electrode 290 may be exposed by the first opening 311. The pixel defining layer 310 may cover side portions (e.g., both side portions) of the connection pattern 295, and a portion (e.g., central portion) of a top surface of the connection pattern 295 may be exposed by the second opening 312. The pixel defining layer 310 may be formed by using an organic insulating material.

Figure 14:
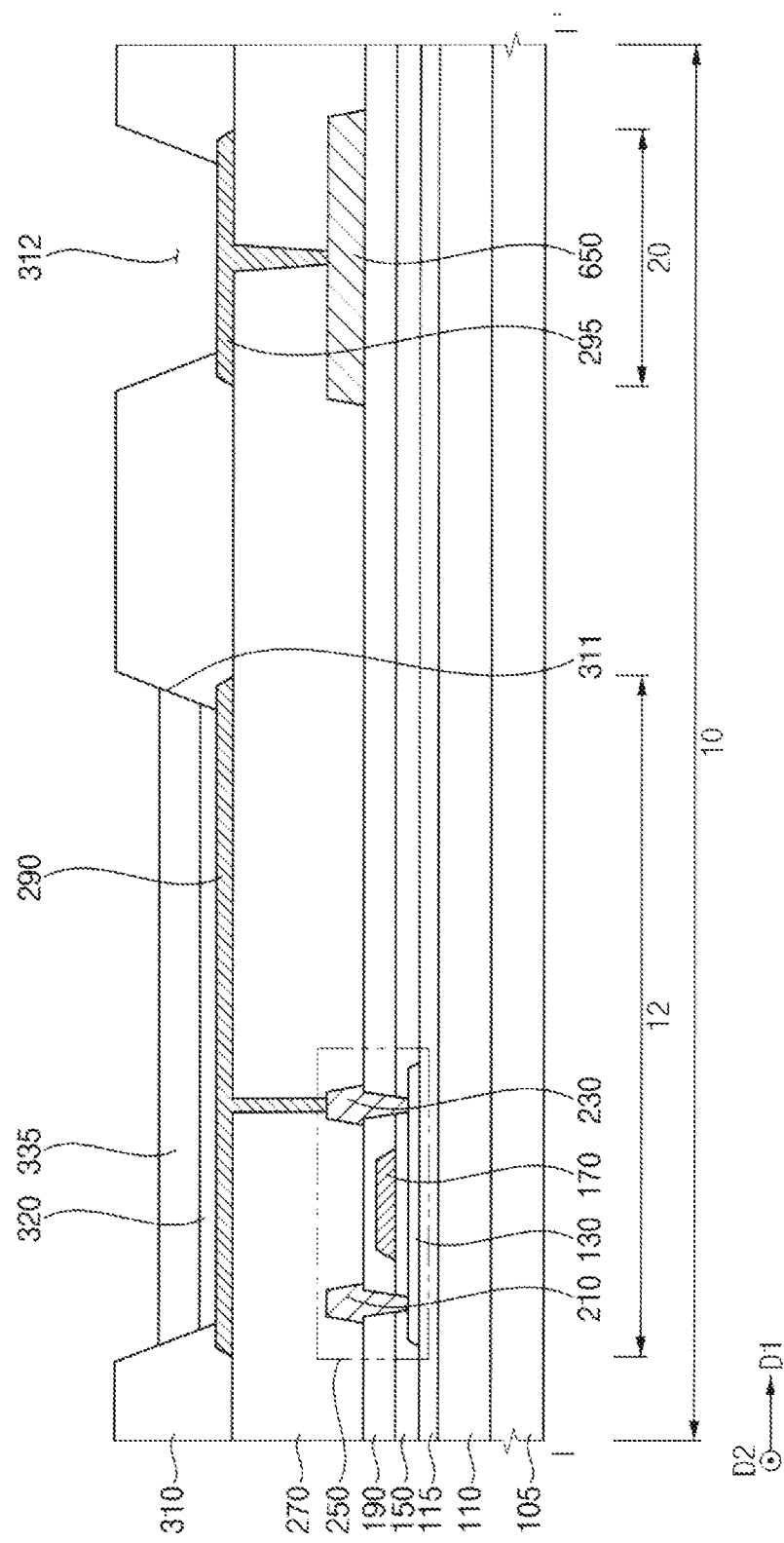

Referring to FIGS. 7 and 14, a lower common layer 320 may be formed on the lower electrode 290, and the lower common layer 320 may be located in the first opening 311 of the pixel defining layer 310. According to the embodiments, the lower common layer 320 may be formed only in the second sub-pixel region 12 by using an inkjet printing method, and may not be formed in the contact region 20. The lower common layer 320 may include a hole injection layer 321 and a hole transport layer 322. The hole injection layer 321 may be formed on the lower electrode 290, and the hole transport layer 322 may be formed on the hole injection layer 321. In other embodiments, only one of the hole injection layer 321 and the hole transport layer 322 may be formed on the lower electrode 290.

For example, the hole injection layer 321 may be formed by using a hole injection material such as TCTA, m-MTDATA, or a combination thereof, and the hole transport layer 322 may be formed by using a hole transport material such as NPB, TPD, NPD, N-phenylcarbazole, polyvinylcarbazole, or a combination thereof. The lower common layer 320 including the hole injection layer 321 and the hole transport layer 322 may be formed by using an organic material.

The light emitting layer 335 may be formed on the lower common layer 320, and the light emitting layer 335 may be located in the first opening 311 of the pixel defining layer 310. The light emitting layer 335 may be formed in the second sub-pixel region 12 on the substrate 110. According to the embodiments, the light emitting layer 335 may be formed only in the second sub-pixel region 12 by using the inkjet printing method, and may not be formed in the contact region 20. The light emitting layer 335 may be formed by using at least one of light emitting materials for emitting different color lights (i.e., red light, green light, blue light, or the like) according to sub-pixels. According to the embodiments, the light emitting layer 335 may be an organic light emitting layer including an organic light emitting material. In other embodiments, the light emitting layer 335 may be formed by stacking light emitting materials for generating different color lights such as the red light, the green light, the blue light, or the like to emit a white light as a whole. A color filter may be formed on the light emitting layer 335 configured to emit the white light. The color filter may include at least one of a red color filter, a green color filter, and a blue color filter. In other embodiments, the color filter may include a yellow color filter, a cyan color filter, and a magenta color filter. The color filter may be formed by using a photosensitive resin or a color photoresist.

Figure 15:
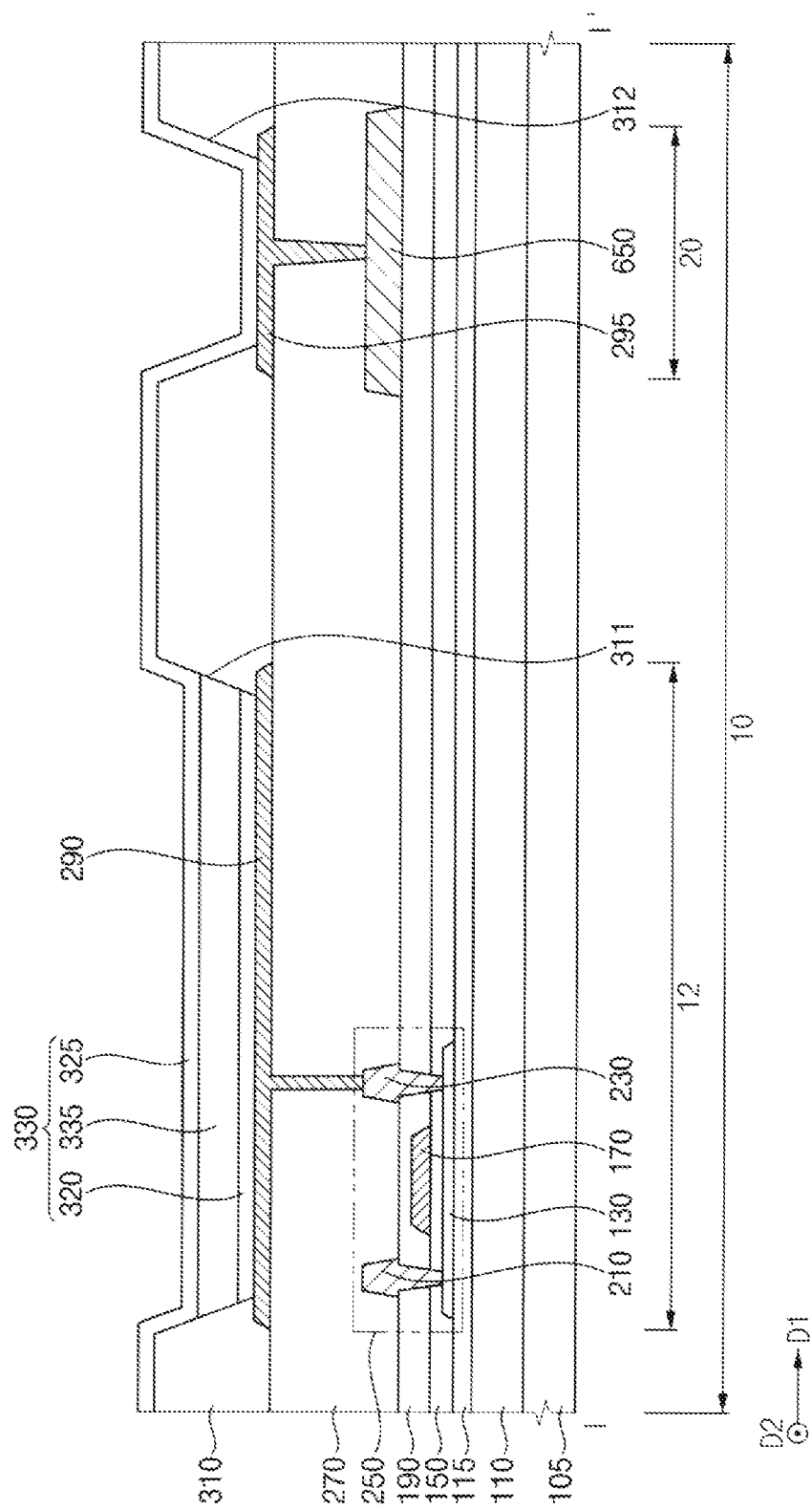

Referring to FIGS. 7 and 15, an upper common layer 325 may be formed on the light emitting layer 335, the pixel defining layer 310, and the connection pattern 295. The upper common layer 325 may be located in both of the first opening 311 and the second opening 312 of the pixel defining layer 310. The upper common layer 325 may be formed over the whole display region 10 on the substrate 110 by using a vacuum deposition method. The upper common layer 325 may include an electron transport layer 327 and an electron injection layer 328. The electron transport layer 327 may be formed on the light emitting layer 335, and the electron injection layer 328 may be formed on the electron transport layer 327. In other embodiments, only one of the electron transport layer 327 and the electron injection layer 328 may be formed on the light emitting layer 335.

For example, the electron transport layer 327 may be formed by using an electron transport material such as Alq3, PBD, BAlq, BCP, TAZ, phenylquinoxaline, or a combination thereof, and the electron injection layer 328 may be formed by using an electron injection material such as TCTA, m-MTDATA, LiF, CsF, or a combination thereof. The upper common layer 325 including the electron transport layer 327 and the electron injection layer 328 may include an organic material.

Accordingly, a light emitting structure 330 including the lower common layer 320, the light emitting layer 335, and the upper common layer 325 may be formed.

Figure 16:
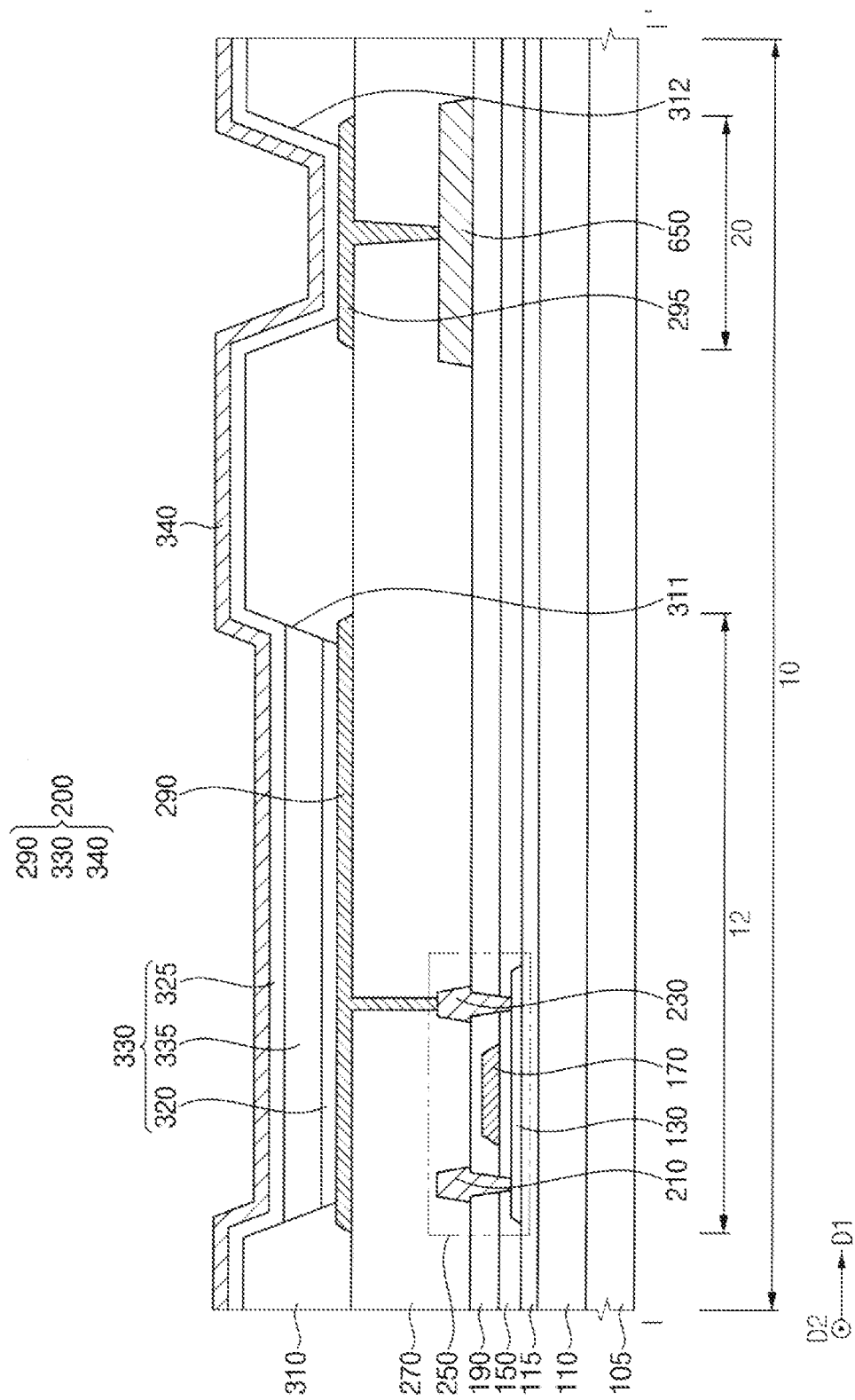
Figure 17:
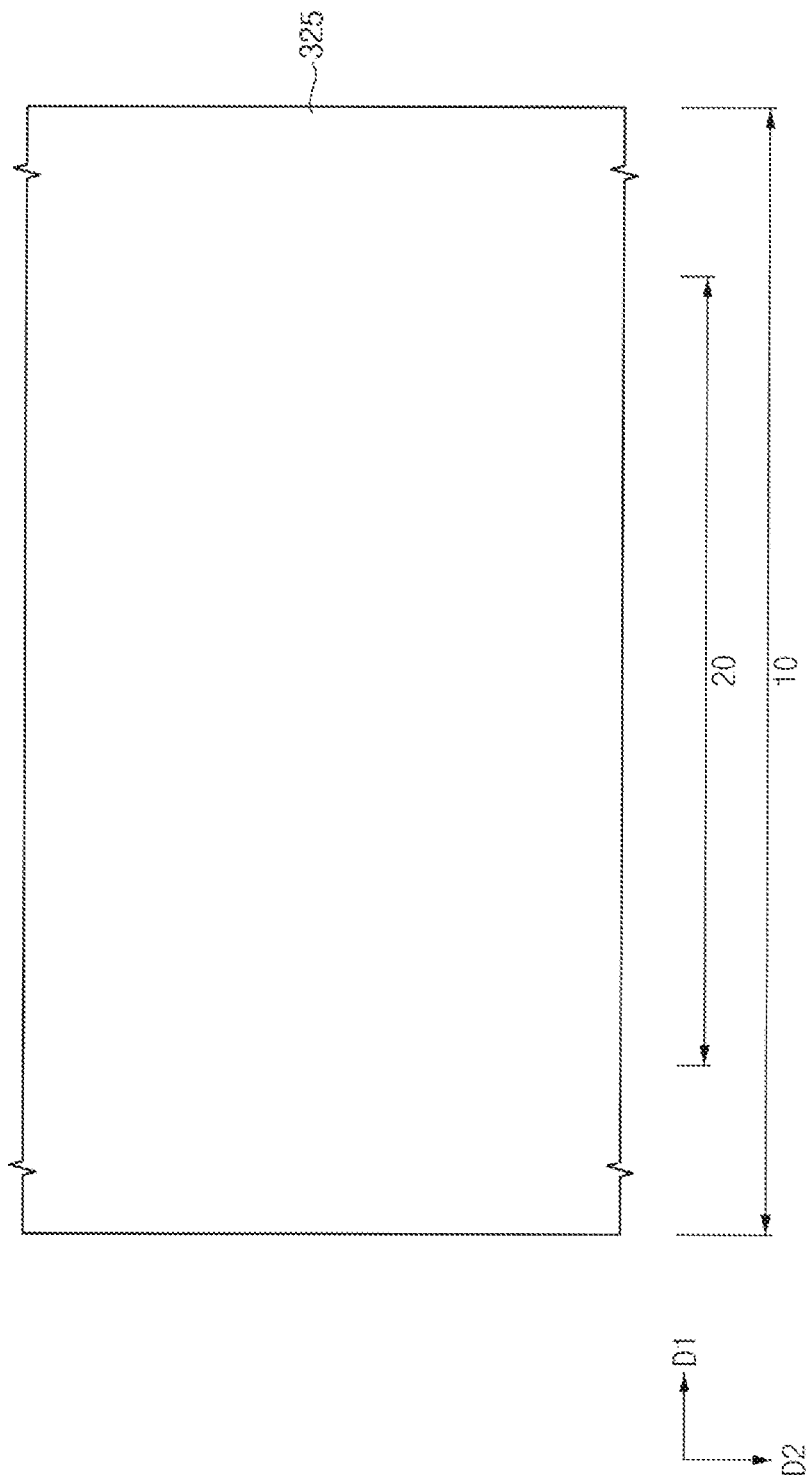

Referring to FIGS. 16 and 17, an upper electrode 340 may be formed on the upper common layer 325. The upper electrode 340 may be formed along a profile of the upper common layer 325. The upper electrode 340 may be formed by using a metal, an alloy, metal nitride, conductive metal oxide, a transparent conductive material, or the like. The above-described materials may be used alone or in combination with each other. According to the embodiments, the upper electrode 340 may include conductive metal oxide such as ITO.

As shown in FIG. 17, a state of the upper common layer 325 formed in the contact region 20 may not be changed while the upper electrode 340 is formed.

Figure 18:
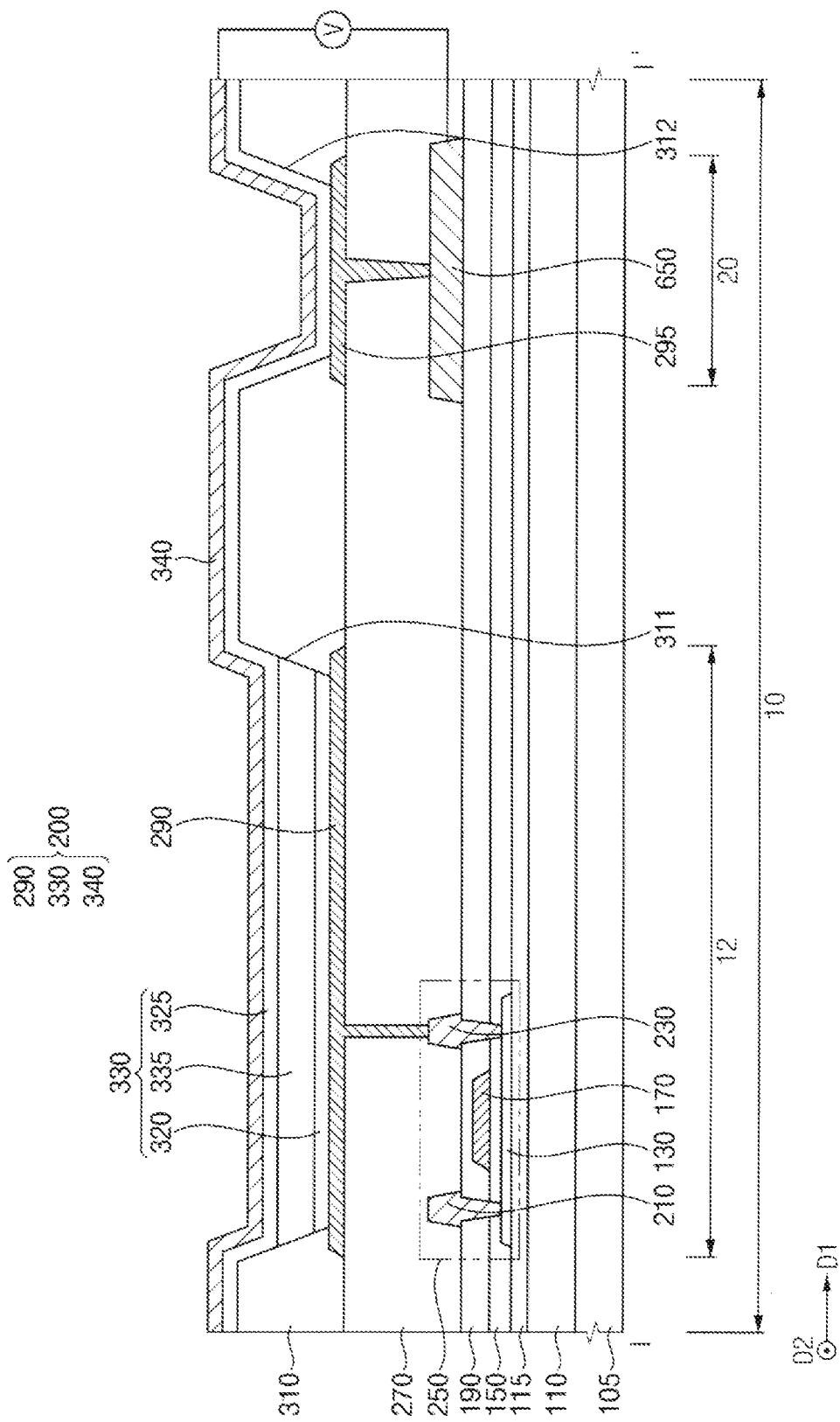

Referring to FIG. 18, after the upper electrode 340 is formed, a preset voltage (e.g., voltage difference) may be applied to the upper electrode 340 and the auxiliary wire 650. Heat may be generated by the voltage applied between the upper electrode 340 and the connection pattern 295. For example, a distance between the upper electrode 340 and the connection pattern 295 may be the shortest in the contact region 20, and a temperature of the heat may be the highest in the contact region 20.

Figure 19:
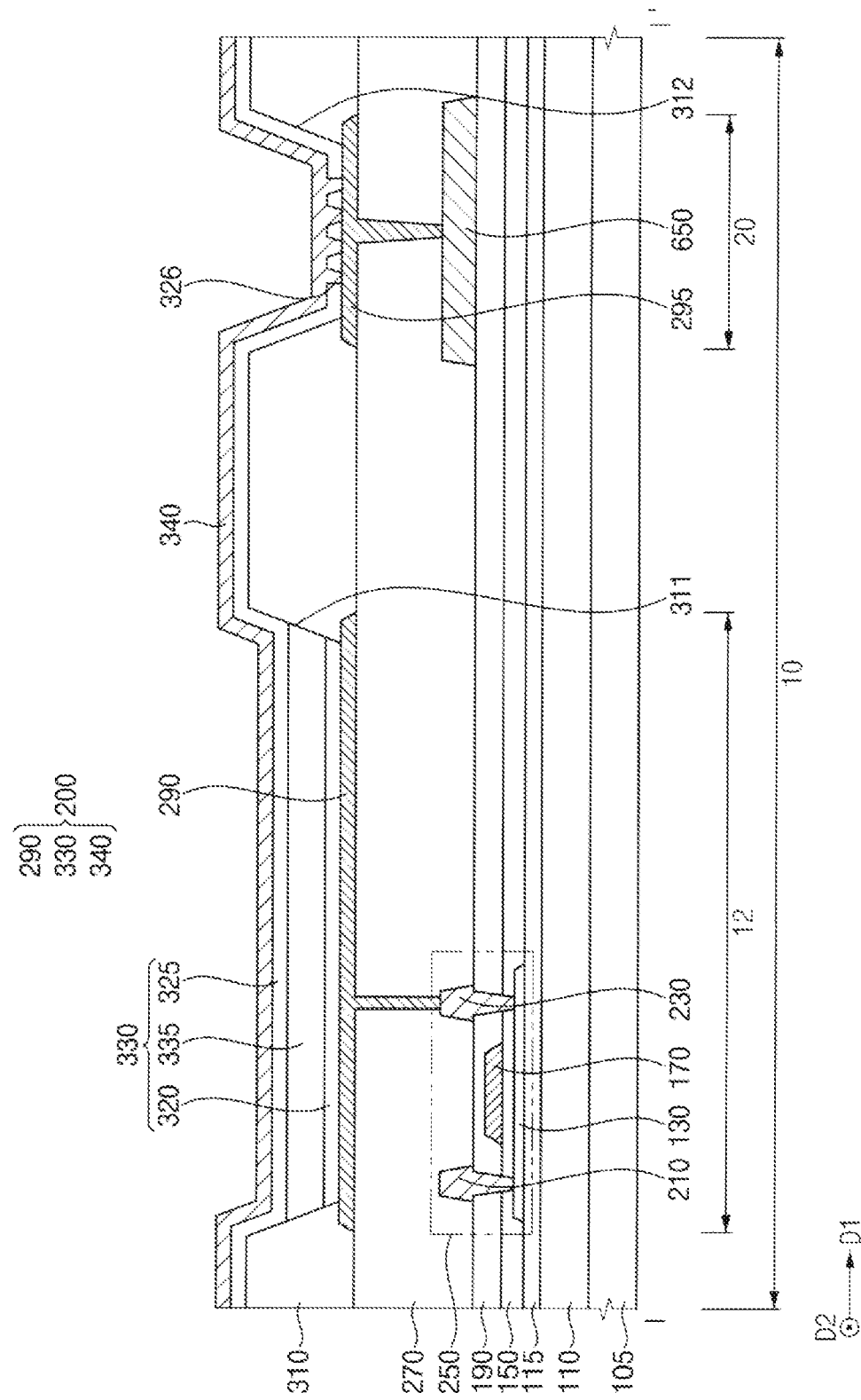

Referring to FIGS. 6 and 19, since the upper common layer 325 has a thin thickness (e.g., approximately 200 angstroms or less), dielectric breakdown may be caused by the heat in the upper common layer 325 located between the upper electrode 340 and the connection pattern 295. For example, a thickness of an insulating layer (e.g., pixel defining layer 310) located between the upper electrode 340 and the connection pattern 295 or a thickness of an insulating layer (e.g., planarization layer 270) located between the upper electrode 340 and the auxiliary wire 650 may be approximately several micrometers or more in a region except for the contact region 20, and the dielectric breakdown may be caused (or formed) only in the contact region 20 and a periphery of the contact region 20.

As shown in FIG. 6, cracks may be generated in the upper common layer 325 formed in the contact region 20, and the cracks may be defined as fine openings 326. The fine openings 326 that expose the top surface of the connection pattern 295 may be formed by the dielectric breakdown in the upper common layer 325 formed in the contact region 20.

In the process of forming the fine openings 326, a portion of the upper electrode 340 located in the contact region 20 and having a thin thickness may be melted by the heat, and the molten upper electrode 340 may fill the fine openings 326. The upper electrode 340 may contact (e.g., directly contact) the connection pattern 295. In other embodiments, ITO, which is an uppermost layer of the connection pattern 295 having a stacked structure of ITO/Ag/ITO, may also be melted by the heat to fill the fine openings 326.

According to the embodiments, the preset voltage (e.g., voltage difference) may correspond to a voltage that may cause the dielectric breakdown by the heat in the upper common layer 325.

Accordingly, a sub-pixel structure 200 including the lower electrode 290, the light emitting structure 330, and the upper electrode 340 may be formed.

A thin film encapsulation structure may be formed on the upper electrode 340. The thin film encapsulation structure may have a structure in which at least one inorganic insulating layer and at least one organic insulating layer are alternately stacked. For example, the stacked structure of the thin film encapsulation structure may include a first inorganic insulating layer, an organic insulating layer, and a second inorganic insulating layer. In other embodiments, an encapsulation substrate may be formed on the upper electrode 340. The encapsulation substrate may be formed by using a quartz substrate, a synthetic quartz substrate, a calcium fluoride substrate, a fluorine-doped quartz substrate, a soda lime glass substrate, a non-alkali glass substrate, or the like.

Referring to FIG. 5, after the thin film encapsulation structure is formed, the glass substrate 105 may be removed from the substrate 110.

Accordingly, the display device 100 shown in FIGS. 1 to 7 may be manufactured.

For example, according to a method of manufacturing a display device, a laser drilling process may be performed to allow an upper electrode to contact a connection pattern. A laser drilling facility has to be additionally provided. A foreign substance may remain after the laser drilling process, and a contact failure between the upper electrode and the connection pattern may be caused.

According to the method of manufacturing the display device, in order to allow the upper electrode to contact the connection pattern, after an upper common layer (e.g., an electron transport layer and an electron injection layer) is formed only in a second sub-pixel region through an inkjet process, the upper electrode and the connection pattern may be electrically connected to each other in a contact region. However, in case that the electron transport layer and the electron injection layer are formed by using an inkjet printing method, a coating defect may be caused by characteristics of materials of the electron transport layer and the electron injection layer.

According to the method of manufacturing the display device, in order to allow the upper electrode to contact the connection pattern, the connection pattern may not be covered by a pixel defining layer, and the upper common layer may be short-circuited by a step of the connection pattern. In order to short-circuit the upper common layer, the connection pattern may have a steep taper angle, or a thick thickness. Process difficulty for connecting the upper electrode with the connection pattern may be increased. A contact area between the upper electrode and the connection pattern may be reduced, and a contact resistance may be increased.

However, according to the method of manufacturing the display device of the embodiments of the disclosure, the fine openings 326 may be formed in the upper common layer 325 through a simple process such as applying a voltage to the auxiliary wire 650 and the upper electrode 340, and the upper electrode 340 and the connection pattern 295 may be readily and electrically connected to each other. Accordingly, a voltage drop may not be caused in the display device 100.

The upper electrode 340 and the connection pattern 295 may be electrically connected to each other without an additional process such as a laser drilling process, and a manufacturing cost of the display device 100 may be reduced.

Figure 20:
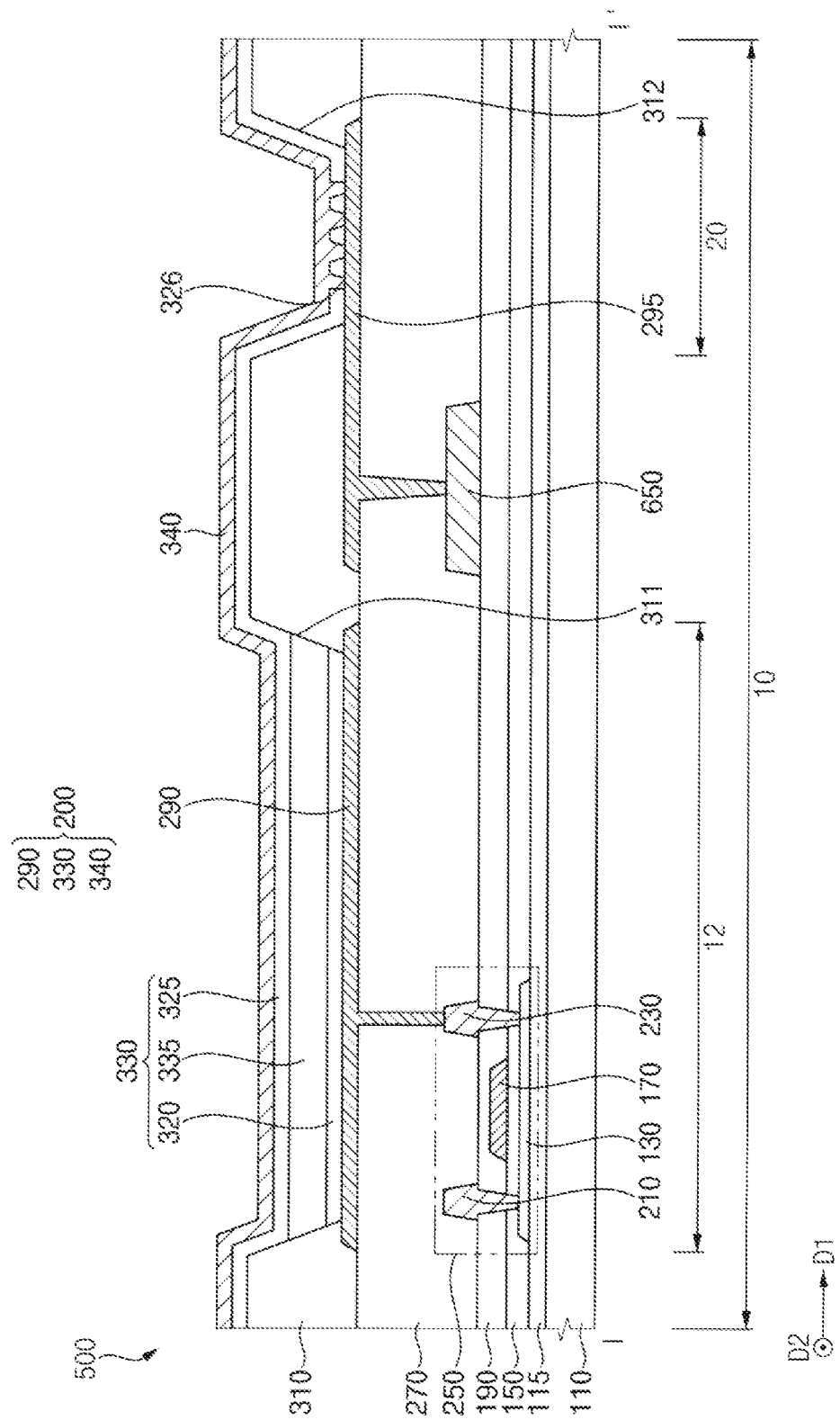
FIG. 20 is a schematic cross-sectional view showing a display device according to embodiments of the disclosure.

FIG. 20 is a schematic cross-sectional view showing a display device according to embodiments of the disclosure. A display device 500 illustrated in FIG. 20 is different from the display device 100 described with reference to FIGS. 1 to 7 at least in that a position of the auxiliary wire 650. In FIG. 20, redundant descriptions of components that are substantially identical or similar to the components described with reference to FIGS. 1 to 7 will be omitted.

Referring to FIG. 20, the display device 500 may include a substrate 110, a buffer layer 115, a semiconductor element 250, an auxiliary wire 650, a planarization layer 270, a connection pattern 295, a sub-pixel structure 200, a pixel defining layer 310, and the like.

The auxiliary wire 650 may be disposed between the second sub-pixel region 12 and the contact region 20 on the interlayer insulating layer 190. For example, the auxiliary wire 650 may have a width in the first direction D1, and may extend in the second direction D2. The auxiliary wire 650 may function as a wire extending in the second direction D2 on the interlayer insulating layer 190.

The connection pattern 295 may be disposed in the contact region 20 and a portion of the display region 10 that is adjacent to the contact region 20 on the planarization layer 270. For example, the connection pattern 295 may have an island shape. The connection pattern 295 may be electrically connected to the auxiliary wire 650 through a contact hole formed in the planarization layer 270, and the contact hole may be located between the second sub-pixel region 12 and the contact region 20. The contact hole may overlap the auxiliary wire 650 (e.g., in a plan view), and the connection pattern 295 may be electrically connected to the auxiliary wire 650, e.g., through the contact hole.

Figure 21:
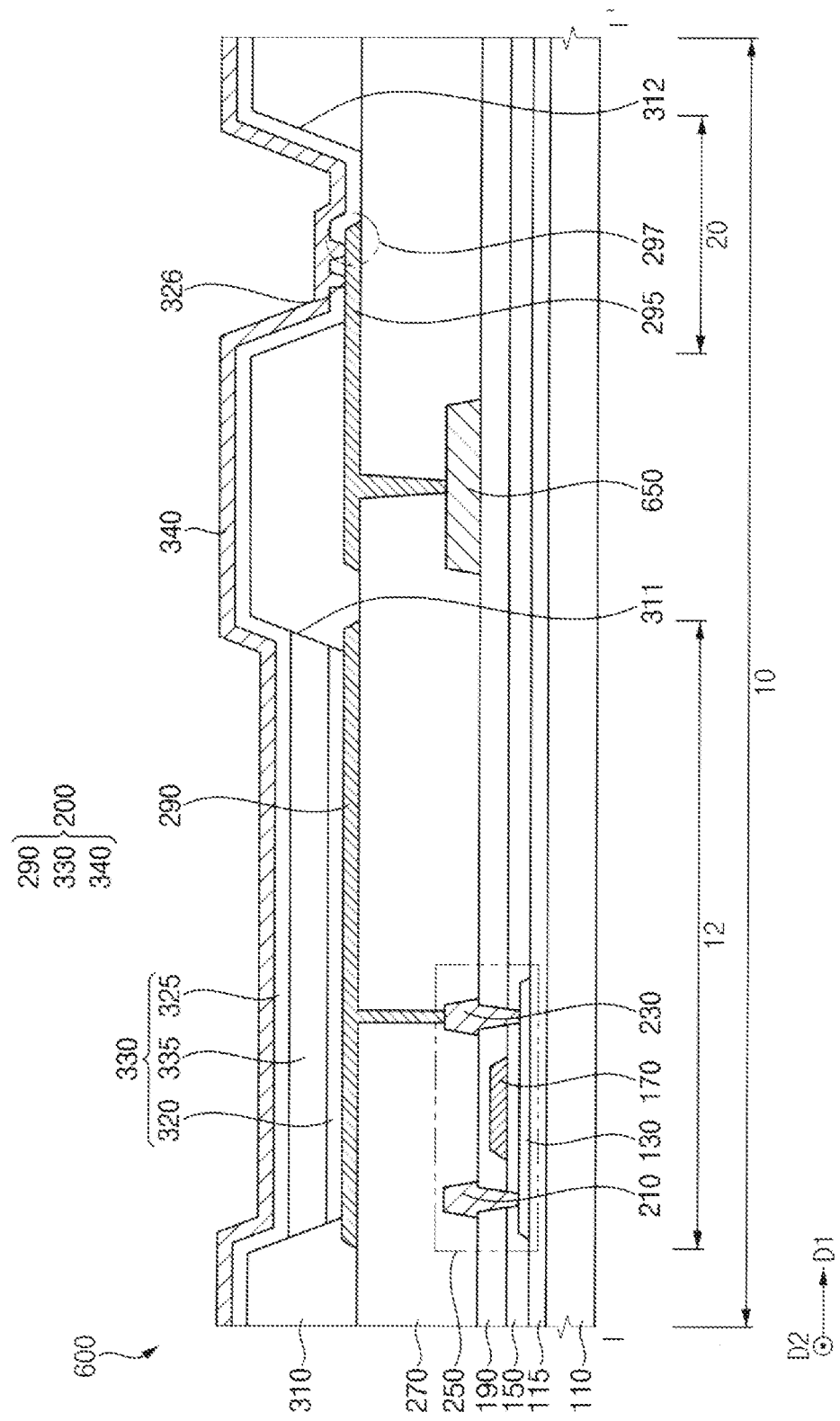
FIG. 21 is a schematic cross-sectional view showing a display device according to embodiments of the disclosure.

FIG. 21 is a schematic cross-sectional view showing a display device according to embodiments of the disclosure. A display device 600 illustrated in FIG. 21 is different from the display device 500 described with reference to FIG. 20 at least in that a shape of the connection pattern 295. In FIG. 21, redundant descriptions of the same constituent components described with reference to FIG. 20 is omitted.

Referring to FIG. 21, the display device 600 may include a substrate 110, a buffer layer 115, a semiconductor element 250, an auxiliary wire 650, a planarization layer 270, a connection pattern 295, a sub-pixel structure 200, a pixel defining layer 310, and the like. The sub-pixel structure 200 may include a lower electrode 290, a light emitting structure 330, and an upper electrode 340. The light emitting structure 330 may include a lower common layer 320, a light emitting layer 335, and an upper common layer 325.

The connection pattern 295 may be disposed in a portion of the contact region 20 and a portion of the display region 10 that is adjacent to the contact region 20 on the planarization layer 270. For example, the connection pattern 295 may have an island shape. A first side portion of the connection pattern 295 may be covered by the pixel defining layer 310, and a second side portion 297 of the connection pattern 295 may protrude from a side wall of the pixel defining layer 310 in the contact region 20.

The pixel defining layer 310 may be disposed on the planarization layer 270. The pixel defining layer 310 may include a first opening 311 formed in the second sub-pixel region 12 and a second opening 312 formed in the contact region 20. According to the embodiments, the pixel defining layer 310 may cover side portions (e.g., both side portions) of the lower electrode 290, and expose a portion (e.g., central portion) of a top surface of the lower electrode 290. The pixel defining layer 310 may cover the first side portion of the connection pattern 295, and expose the second side portion 297 of the connection pattern 295. A top surface of the planarization layer 270 may be exposed by the second opening 312 in the contact region 20.

The upper common layer 325 may be disposed on the light emitting layer 335, the pixel defining layer 310, the connection pattern 295, and the top surface of the planarization layer 270 exposed by the second opening 312, and the upper common layer 325 may be located in both the first opening 311 and the second opening 312 of the pixel defining layer 310. The upper common layer 325 may be disposed over the whole display region 10 on the substrate 110. According to the embodiments, the upper common layer 325 may contact (e.g., directly contact) the planarization layer 270 in the contact region 20.

The upper common layer 325 disposed in the contact region 20 may include fine openings 326 that expose a top surface (e.g., portion of top surface) of the connection pattern 295. For example, the fine openings 326 may be adjacent to a portion of the upper common layer 325 in which the connection pattern 295 and the upper electrode 340 overlap each other in a plan view.

For example, according to a method of manufacturing the display device 600, after the upper electrode 340 is formed, a preset voltage (e.g., voltage difference) may be applied to the upper electrode 340 and the auxiliary wire 650. Since the upper common layer 325 has a thin thickness (e.g., approximately 200 angstroms or less), dielectric breakdown may be caused by heat, which is generated by a voltage applied between the upper electrode 340 and the connection pattern 295, in the upper common layer 325 located between the upper electrode 340 and the connection pattern 295. Cracks may be generated in the upper common layer 325 disposed in the contact region 20, the cracks may be defined as the fine openings 326, and the fine openings 326 may expose the top surface (e.g., portion of top surface) of the connection pattern 295. In this process, a portion of the upper electrode 340 having a thin thickness may be melted to fill the fine openings 326, and the upper electrode 340 may contact (e.g., directly contact) the connection pattern 295. In other embodiments, ITO, which is an uppermost layer of the connection pattern 295 having a stacked structure of ITO/Ag/ITO, may also be melted by the heat to fill the fine openings 326.

According to the embodiments, in case that a preset voltage (e.g., voltage difference) is applied to the upper electrode 340 and the auxiliary wire 650, the second side portion 297 of the connection pattern 295 may function as a fringe field. The preset voltage for causing the dielectric breakdown may be reduced due to the second side portion 297 of the connection pattern 295.

Figure 22:
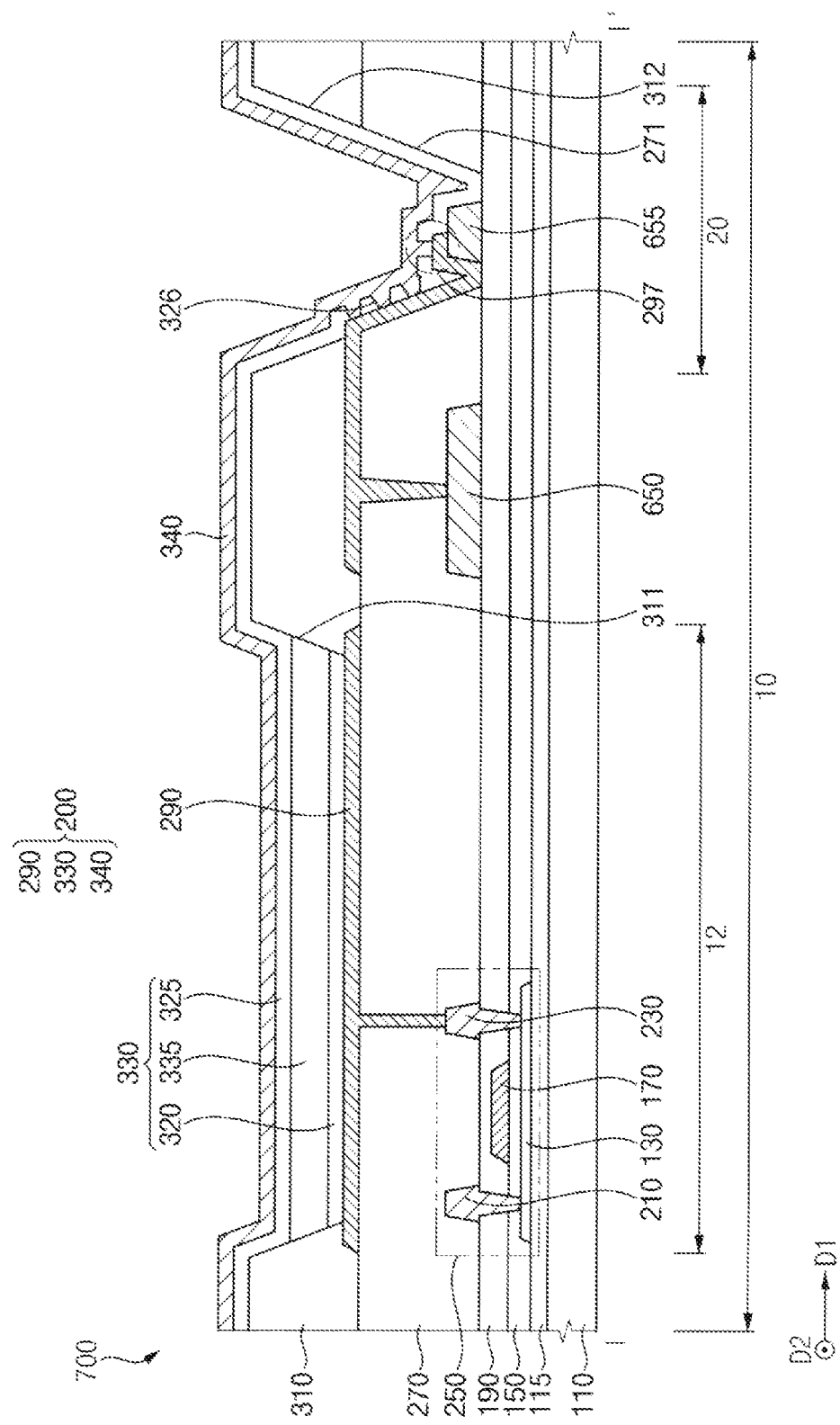
FIG. 22 is a schematic cross-sectional view showing a display device of the disclosure.

FIG. 22 is a schematic cross-sectional view showing a display device according to embodiments of the disclosure. A display device 700 illustrated in FIG. 22 is different from the display device 600 described with reference to FIG. 21 at least in that a shape of the connection pattern 295, a shape of the planarization layer 270, and a contact pattern 655. In FIG. 22, redundant descriptions of components that are substantially identical or similar to the components described with reference to FIG. 21 will be omitted.

Referring to FIG. 22, the display device 700 may include a substrate 110, a buffer layer 115, a semiconductor element 250, an auxiliary wire 650, a contact pattern 655, a planarization layer 270, a connection pattern 295, a sub-pixel structure 200, a pixel defining layer 310, and the like. The semiconductor element 250 may include an active layer 130, a gate insulating layer 150, a gate electrode 170, an interlayer insulating layer 190, a source electrode 210, and a drain electrode 230. The sub-pixel structure 200 may include a lower electrode 290, a light emitting structure 330, and an upper electrode 340. The light emitting structure 330 may include a lower common layer 320, a light emitting layer 335, and an upper common layer 325.

The auxiliary wire 650 may be disposed between the second sub-pixel region 12 and the contact region 20 on the interlayer insulating layer 190. For example, the auxiliary wire 650 may have a width in the first direction D1, and may extend in the second direction D2. The auxiliary wire 650 may function as a wire extending in the second direction D2 on the interlayer insulating layer 190.

The contact pattern 655 may be disposed in the contact region 20 on the interlayer insulating layer 190. For example, multiple contact patterns 655 may be disposed on the same layer as the auxiliary wire 650 and spaced apart from each other. The contact pattern 655 may have an island shape. According to the embodiments, a portion of the contact pattern 655 may contact (e.g., directly contact) the connection pattern 295, and a remaining portion of the contact pattern 655 may contact (e.g., directly contact) the upper common layer 325.

The planarization layer 270 may be disposed on the interlayer insulating layer 190, the semiconductor element 250, and the auxiliary wire 650. According to the embodiments, the planarization layer 270 may have a first opening 271 that exposes a top surface (e.g., portion of top surface) of the interlayer insulating layer 190 in the contact region 20. The first opening 271 may expose the contact pattern 655.

The connection pattern 295 may be disposed in a portion of the contact region 20 and a portion of the display region 10 that is adjacent to the contact region 20 on the planarization layer 270. For example, the connection pattern 295 may have an island shape. A first side portion of the connection pattern 295 may be covered by the pixel defining layer 310, and a second side portion 297 of the connection pattern 295 may protrude from a side wall of the pixel defining layer 310 in the contact region 20. The connection pattern 295 may extend in the first direction D1 between the pixel defining layer 310 and the planarization layer 270. The planarization layer 270 may be disposed along a side wall of the first opening 271. The second side portion 297 may be disposed on the contact pattern 655. A step of the connection pattern 295 may be generated by the contact pattern 655.

The pixel defining layer 310 may be disposed on the planarization layer 270. The pixel defining layer 310 may cover the first side portion of the connection pattern 295, and may have a second opening 312 that exposes the second side portion 297 of the connection pattern 295. The first opening 271 and the second opening 312 may overlap each other in a plan view, and a top surface (e.g., portion of top surface) of the interlayer insulating layer 190 may be exposed by the first opening 271 and the second opening 312 in the contact region 20.

The upper common layer 325 may be disposed on the light emitting layer 335, the pixel defining layer 310, the connection pattern 295, the contact pattern 655, and the top surface (e.g., portion of top surface) of the interlayer insulating layer 190 exposed by the second opening 312 and the first opening 271. According to the embodiments, the upper common layer 325 may contact (e.g., directly contact) the interlayer insulating layer 190 in the contact region 20.

According to the embodiments, in case that a preset voltage is applied to the upper electrode 340 and the auxiliary wire 650, the second side portion 297 of the connection pattern 295 may function as a fringe field. The step of the connection pattern 295 may be generated by the contact pattern 655, and the fringe field may be increased. The preset voltage for causing the dielectric breakdown may be reduced.

The disclosure may be applied to various electronic devices including a display device. For example, the disclosure may be applied to numerous electronic devices such as vehicle-display devices, ship-display devices, aircraft-display devices, portable communication devices, exhibition display devices, information transfer display devices, medical-display devices, or the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. Therefore, it is to be understood that the foregoing is illustrative of various embodiments and is not to be construed as being limited to the specific embodiments disclosed, and that modifications to the disclosed embodiments, as well as other embodiments, are intended to be included within the scope of the appended claims.

What is claimed is:

1. A display device comprising:
   a sub-pixel region and a contact region;
   an auxiliary wire on a substrate in the contact region;
   a connection pattern on the auxiliary wire; and
   a sub-pixel in sub-pixel region, sub-pixel including
      a light emitting layer on the substrate in the sub-pixel region,
      an upper common layer on the light emitting layer and the connection pattern, the upper common layer including a plurality of fine openings that expose the connection pattern,
      an upper electrode on the upper common layer, and
      a pixel defining layer disposed-between the substrate and the upper electrode,
   wherein the upper electrode contacts the connection pattern through the plurality of fine openings,
   wherein the pixel defining layer includes:
      a first opening in the sub-pixel region; and
      a second opening in the contact region, and
   wherein the light emitting layer is not in the second opening.

2. The display device of claim 1, wherein the plurality of fine openings are adjacent to a portion in which the connection pattern and the upper electrode overlap each other in a plan view.

3. The display device of claim 1, wherein
   the light emitting layer is only in the first opening, and
   the upper common layer is in the first opening and the second opening.

4. The display device of claim 1, wherein the pixel defining layer overlaps side portions of the connection pattern in a plan view.

5. The display device of claim 1, further comprising a lower electrode in the sub-pixel region between the substrate and the light emitting layer.

6. The display device of claim 5, wherein the lower electrode and the connection pattern are on a same layer.

7. The display device of claim 5, further comprising:
   a lower common layer in the sub-pixel region between the lower electrode and the light emitting layer.

8. The display device of claim 7, wherein each of the upper common layer and the lower common layer includes an organic material.

9. The display device of claim 1, further comprising:
   a planarization layer between the substrate and the light emitting layer, wherein
   the pixel defining layer is on the planarization layer, and
   the pixel defining layer covers a first side portion of the connection pattern in a plan view and exposes a second side portion of the connection pattern.

10. The display device of claim 9, wherein the upper common layer directly contacts the planarization layer in the contact region.

11. The display device of claim 1, further comprising:
a plurality of sub-pixels in the sub-pixel region, the plurality of sub-pixels including the sub-pixel.

12. A display device comprising:
a sub-pixel region and a contact region;
an auxiliary wire on a substrate in the contact region;
a connection pattern on the auxiliary wire;
a light emitting layer on the substrate in the sub-pixel region;
an upper common layer on the light emitting layer and the connection pattern, and including openings that expose the connection pattern;
an upper electrode on the upper common layer;
an interlayer insulating layer on the substrate;
a planarization layer on the interlayer insulating layer, the planarization layer having a first opening that exposes the interlayer insulating layer in the contact region; and
a pixel defining layer disposed on the planarization layer, wherein
the pixel defining layer covers a first side portion of the connection pattern in a plan view, and
the pixel defining layer has a second opening that exposes a second side portion of the connection pattern.

13. The display device of claim 12, wherein the upper common layer contacts the interlayer insulating layer in the contact region.

14. The display device of claim 12, further comprising:
a contact pattern in the contact region on the interlayer insulating layer.

15. The display device of claim 14, wherein
a first portion of the contact pattern contacts the connection pattern, and
a second portion of the contact pattern contacts the upper common layer.

16. The display device of claim 15, wherein the contact pattern and the auxiliary wire are on a same layer.

* * * * *